(12) United States Patent
Li et al.

(10) Patent No.: US 12,419,038 B2
(45) Date of Patent: Sep. 16, 2025

(54) SEMICONDUCTOR STRUCTURE, METHOD FOR FORMING SAME, AND LAYOUT STRUCTURE

(71) Applicant: CHANGXIN MEMORY TECHNOLOGIES, INC., Hefei (CN)

(72) Inventors: Xiaojie Li, Hefei (CN); Daohuan Feng, Hefei (CN); Meng Huang, Hefei (CN); Yi Tang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 485 days.

(21) Appl. No.: 17/954,491

(22) Filed: Sep. 28, 2022

(65) Prior Publication Data
US 2023/0017086 A1    Jan. 19, 2023

Related U.S. Application Data

(63) Continuation of application No. PCT/CN2022/108679, filed on Jul. 28, 2022.

(30) Foreign Application Priority Data

Jun. 24, 2022   (CN) .......................... 202210730862.4

(51) Int. Cl.
H10B 12/00        (2023.01)

(52) U.S. Cl.
CPC .......... *H10B 12/315* (2023.02); *H10B 12/03* (2023.02); *H10B 12/482* (2023.02); *H10B 12/488* (2023.02)

(58) Field of Classification Search
CPC .... H10B 12/315; H10B 12/03; H10B 12/482; H10B 12/488; H10B 12/05; H10D 1/714; H10D 30/6757; H10D 89/10
See application file for complete search history.

(56) References Cited

U.S. PATENT DOCUMENTS 11,227,864 B1    1/2022   Saeedi Vahdat
11,355,496 B2    6/2022   Manfrini et al.
(Continued)

FOREIGN PATENT DOCUMENTS

CN    112331663 A    2/2021
CN    113130494 A    7/2021
(Continued)

OTHER PUBLICATIONS

First Office Action of the Taiwanese application No. 112120921, issued on Feb. 17, 2024, 6 pages with English abstract.

*Primary Examiner* — Ratisha Mehta
*Assistant Examiner* — Sophia W Kao
(74) *Attorney, Agent, or Firm* — SYNCODA LLC; Feng Ma

(57) ABSTRACT

Embodiments of the disclosure provide a semiconductor substrate, a method for forming same, and a layout structure. The method includes: providing a semiconductor structure including a first region and a second region arranged in sequence along a second direction, the second region including active structures arranged in an array along a first direction and a third direction, each of the active structure at least including a channel structure, the first direction, the second direction, and the third direction being perpendicular to each other, and the first direction and the second direction being parallel to a surface of the semiconductor substrate; forming a gate structure on a surface of the channel structure; and forming a word line structure extending in the first direction on the first region. The word line structure is connected with the gate structure located on the same layer.

20 Claims, 35 Drawing Sheets

```
┌─────────────────────────────────────────────────────────────┐
│ A semiconductor substrate is provided, and includes a first │
│ region and a second region arranged in sequence along a     │── S101
│ second direction; the second region includes active         │
│ structures arranged in an array along a first direction and │
│ a third direction; each of the active structures at least   │
│ includes a channel structure                                │
└─────────────────────────────────────────────────────────────┘
                               ↓
┌─────────────────────────────────────────────────────────────┐
│ A gate structure is formed on a surface of the channel      │── S102
│ structure                                                   │
└─────────────────────────────────────────────────────────────┘
                               ↓
┌─────────────────────────────────────────────────────────────┐
│ A word line structure extending along the first direction   │── S103
│ is formed in the first region, and is connected with the    │
│ gate structure located on a same layer                      │
└─────────────────────────────────────────────────────────────┘
```

(56) References Cited

U.S. PATENT DOCUMENTS

| | | | |
|---|---|---|---|
| 2012/0326219 | A1 | 12/2012 | Lu et al. |
| 2013/0087839 | A1 | 4/2013 | Kuo |
| 2020/0111793 | A1* | 4/2020 | Kim .................. H10D 88/00 |
| 2021/0043629 | A1* | 2/2021 | Kim .................. H10B 12/03 |
| 2021/0183862 | A1 | 6/2021 | Son et al. |
| 2021/0202488 | A1 | 7/2021 | Choi |
| 2021/0257370 | A1 | 8/2021 | Son |
| 2021/0375875 | A1* | 12/2021 | Brewer ............. H10D 30/6757 |
| 2021/0375939 | A1* | 12/2021 | Zhu ................... H10D 30/6728 |
| 2022/0013524 | A1 | 1/2022 | Ryu et al. |
| 2022/0045062 | A1 | 2/2022 | Saeedi Vahdat et al. |
| 2022/0068929 | A1 | 3/2022 | Karda et al. |
| 2022/0102394 | A1 | 3/2022 | Liu et al. |
| 2022/0122977 | A1 | 4/2022 | Kim |
| 2022/0130831 | A1 | 4/2022 | Lee et al. |
| 2022/0285355 | A1 | 9/2022 | Manfrini et al. |
| 2022/0352171 | A1 | 11/2022 | Lee et al. |

FOREIGN PATENT DOCUMENTS

| | | |
|---|---|---|
| CN | 113284898 A | 8/2021 |
| CN | 113644066 A | 11/2021 |
| CN | 113903741 A | 1/2022 |
| CN | 114068425 A | 2/2022 |
| CN | 114121814 A | 3/2022 |
| CN | 114121820 A | 3/2022 |
| CN | 114334836 A | 4/2022 |
| JP | 2016009788 A | 1/2016 |
| TW | 201301449 A | 1/2013 |
| TW | 201316491 A | 4/2013 |
| TW | 202131451 A | 8/2021 |

\* cited by examiner

SEMICONDUCTOR STRUCTURE, METHOD FOR FORMING SAME, AND LAYOUT STRUCTURE

CROSS-REFERENCE TO RELATED APPLICATIONS

This application is a U.S. continuation application of International Application No. PCT/CN2022/108679, filed on Jul. 28, 2022, which is based upon and claims priority to Chinese Patent Application No. 202210730862.4, filed on Jun. 24, 2022. The disclosures of International Application No. PCT/CN2022/108679 and Chinese Patent Application No. 202210730862.4 are hereby incorporated by reference in their entireties.

TECHNICAL FIELD

The disclosure relates to the technical field of semiconductors, and relates, but is not limited, to a semiconductor structure, a method for forming the same, and a layout structure.

BACKGROUND

3D Dynamic Random Access Memories (3D DRAM) mostly adopt a horizontal word line structure. However, the manufacturing process of the horizontal word line structure has high complexity. In addition, since a word line transistor is very sensitive to a device function, the length and the width of a gate are very difficult to control by current 3D DRAM processes.

SUMMARY

In view of this, embodiments of the disclosure provide a semiconductor structure, a method for forming the same, and a layout structure.

In a first aspect, embodiments of the disclosure provide a method for forming a semiconductor structure. The method includes the following operations.

A semiconductor substrate is provided, and includes a first region and a second region arranged in sequence along a second direction. The second region includes active structures arranged in an array along a first direction and a third direction. Each of the active structures at least includes a channel structure. The first direction, the second direction, and the third direction are perpendicular to each other, and the first direction and the second direction are parallel to a surface of the semiconductor substrate.

A gate structure is formed on a surface of the channel structure.

A word line structure extending along the first direction is formed in the first region, and is connected with the gate structure located on a same layer.

In a second aspect, embodiments of the disclosure provide a semiconductor structure, which at least includes a semiconductor substrate, active structures, a word line structure, and a gate structure.

The semiconductor substrate includes a first region and a second region arranged in sequence along a second direction.

The active structures are located on the second region and are arranged in an array along a first direction and a third direction. Each of the active structures at least includes a channel structure. The first direction, the second direction, and the third direction are perpendicular to each other, and the first direction and the second direction are parallel to a surface of the semiconductor substrate.

The word line structure is located in the first region and extends along the first direction.

The gate structure is located on a surface of the channel structure. The word line structure is connected to the gate structure located on a same layer.

BRIEF DESCRIPTION OF THE DRAWINGS

In the drawings (which are not necessarily drawn to scale), similar reference signs may describe similar parts in different views. Similar reference signs with different letter suffixes may represent different examples of similar parts. The drawings generally illustrate the various embodiments discussed herein by way of examples rather than limitation.

DETAILED DESCRIPTION

Figure 1:
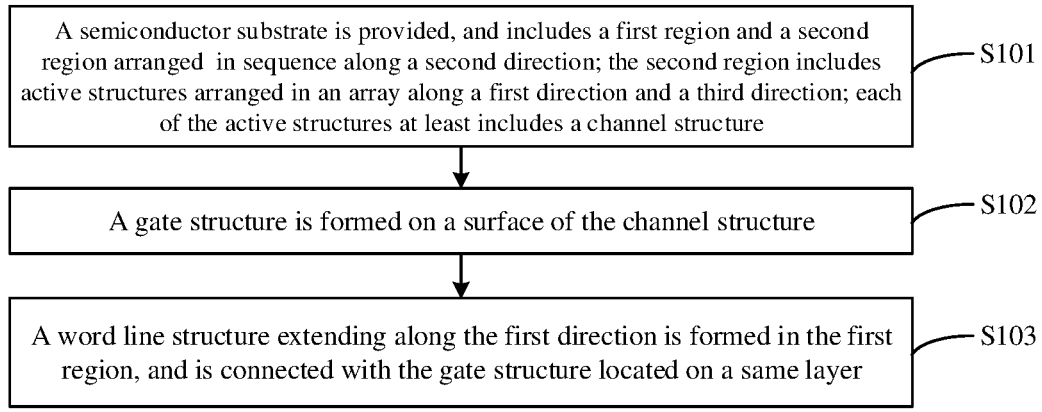
FIG. 1 schematically illustrates a flowchart of a method for forming a semiconductor structure provided by the embodiments of the disclosure.

Exemplary implementation modes of the disclosure will be described below in more detail with reference to the drawings. Although the exemplary implementation modes of the disclosure are shown in the drawings, it should be understood that, the disclosure may be implemented in various forms and should not be limited by the specific implementation modes elaborated herein. On the contrary, these implementation modes are provided to enable a more thorough understanding of the disclosure and to fully convey the scope of the disclosure to those skilled in the art.

In the following description, a large number of details are given to provide a more thorough understanding of the disclosure. However, it will be apparent to those skilled in the art that the disclosure may be implemented without one or more of these details. In other examples, in order to avoid confusion with the disclosure, some technical features known in the art are not described. That is, not all of the features of the actual embodiments are described here, and the known functions and structures are not described in detail.

In the drawings, the dimensions of a layer, an area, and an element and their relative dimensions may be exaggerated for clarity. Throughout, the same reference signs represent the same elements.

It is to be understood that while an element or layer is referred to as being "on", "adjacent to", "connected to" or "coupled to" other elements or layers, it may be directly on the other elements or layers, adjacent to, connected or coupled to the other elements or layers, or an intermediate element or layer may be existent. On the contrary, while the element is referred to as being "directly on", "directly adjacent to", "directly connected to" or "directly coupled to" other elements or layers, the intermediate element or layer is not existent. It should be understood that although terms "first", "second", "third" and the like may be used to describe various elements, components, areas, layers and/or sections, these elements, components, areas, layers and/or sections should not be limited by these terms. These terms are only used to distinguish one element, component, area, layer or section from another element, component, area, layer or section. Therefore, without departing from the teaching of the disclosure, a first element, component, area, layer, or section discussed below may be represented as a second element, component, area, layer, or section. While the second element, component, area, layer, or section is discussed, it does not mean that the first element, component, area, layer, or section is necessarily existent in the disclosure.

The term used herein is only to describe the specific embodiments and not as limitation to the disclosure. While used herein, singular forms of "a", "an" and "said/the" are also intended to include plural forms, unless the context clearly indicates another mode. It should also be understood that terms "consisting" and/or "including", while used in the description, determine the existence of the described features, integers, steps, operations, elements and/or components, but do not exclude the existence or addition of one or more other features, integers, steps, operations, elements, components, and/or groups. As used herein, a term "and/or" includes any and all combinations of related items listed.

Before introducing the embodiments of the disclosure, three directions for describing the stereo structure that may be used in the following embodiments are defined first. Taking a Cartesian coordinate system as an example, the three directions may include an X-axis direction, a Y-axis direction, and a Z-axis direction. The semiconductor substrate may include a top surface located on a front side and a bottom surface located on a back side opposite to the front side. The direction perpendicular to the top surface and the bottom surface of the semiconductor substrate is defined as the third direction in a case of ignoring the flatness of the top surface and the bottom surface. In the direction of the top surface and the bottom surface (that is, the plane on which the semiconductor substrate is located) of the semiconductor substrate, two directions that are intersected each other (e.g., perpendicular to each other) are defined. For example, the direction in which the word line extends, may be defined as the first direction, and the direction in which the capacitor structure extends, may be defined as the second direction. Based on the first direction and the second direction, a plane direction of the semiconductor substrate may be determined. Here, the first direction, the second direction, and the third direction are perpendicular to each other. In the embodiments of the disclosure, the first direction is defined as an X-axis direction, the second direction is defined as the Y-axis direction, and the third direction is defined as the Z-axis direction.

The embodiments of the disclosure provide a method for forming a semiconductor structure. FIG. 1 schematically illustrates a flowchart of a method for forming a semiconductor structure provided by the embodiments of the disclosure. As shown in FIG. 1, the method for forming the semiconductor structure includes the following operations.

At S101, a semiconductor substrate is provided. The semiconductor substrate includes a first region and a second region arranged in sequence along a second direction. The second region includes active structures arranged in an array along a first direction and a third direction. Each of the active structures at least includes a channel structure.

In the embodiments of the disclosure, the semiconductor substrate may be a silicon substrate. The semiconductor substrate may also include other semiconductor elements such as Germanium (Ge), or semiconductor compounds such as Silicon Carbide (SiC), Gallium Arsenide (GaAs), Gallium Phosphide (GaP), Indium Phosphide (InP), Indium Arsenide (InAs), or Indium Antimonide (InSb), or other semiconductor alloys such as Silicon Germanium (SiGe), Gallium Arsenide Phosphide (GaAsP), Indium Aluminum Arsenide (AlInAs), Gallium Aluminum Arsenide (AlGaAs), Indium Gallium Arsenide (GaInAs), Indium Gallium Phosphide (GaInP), and/or Indium Gallium Arsenide Phosphide (GaInAsP) or a combination thereof.

In the embodiments of the disclosure, the first region and the second region may respectively be arranged to form different functional structures. For example, the first region may be arranged to form a word line structure, while the second region may be arranged to form a gate structure, a capacitor structure, and a bit line structure.

In the embodiments of the disclosure, the active structure at least includes a channel structure. In other embodiments, the active structure further includes an active pillar. The active pillar and the channel structure are arranged in sequence along the second direction, and the channel structure is connected with the active pillar.

In the embodiments of the disclosure, the cross section of the active pillar along the third direction may be circular, square, or arbitrarily polygonal.

In the embodiments of the disclosure, the projection of the channel structure on the semiconductor substrate is U-shaped or rectangular.

In other embodiments, the projection of the channel structure on the semiconductor substrate may also be convex or L-shaped.

At S102, a gate structure is formed on a surface of the channel structure.

In the embodiments of the disclosure, the gate structure includes a gate dielectric layer and a gate conductive layer located on a surface of the gate dielectric layer. The gate structure may be a five-sided Gate-All-Around structure. For example, the gate structure covers a first surface and a second surface of the channel structure along the third direction, a third surface and a fourth surface of the channel structure along the first direction, and a fifth surface of the channel structure along the second direction.

At S103, a word line structure extending along the first direction is formed in the first region. The word line structure is connected with the gate structure located on the same layer.

In the embodiments of the disclosure, the word line structure extends along the first direction. That is, the word line structure is horizontal, so that not only the interconnection of the word lines on the same plane of multi-layer stacked structure can be interconnected, but also the dimension of the word line can be controlled, thereby reducing a coupling effect between word line steps.

The method for forming the semiconductor structure provided by the embodiments of the disclosure can realize the control of the length and the width of the gate. The formed word line structure is horizontal, and the horizontal word line structure may be directly formed by filling, which reduces the complexity of the manufacturing process of the horizontal word line structure, thereby reducing the manufacturing cost of the semiconductor structure.

FIG. 2A to FIG. 2L and FIG. 3A to FIG. 3K schematically illustrate structures during the process for forming the semiconductor structure provided by the embodiments of the disclosure. The process for forming the semiconductor structure provided by the embodiments of the disclosure will be further described below in detail with reference to FIG. 2A to FIG. 2L and FIG. 3A to FIG. 3K.

Figure 2A:
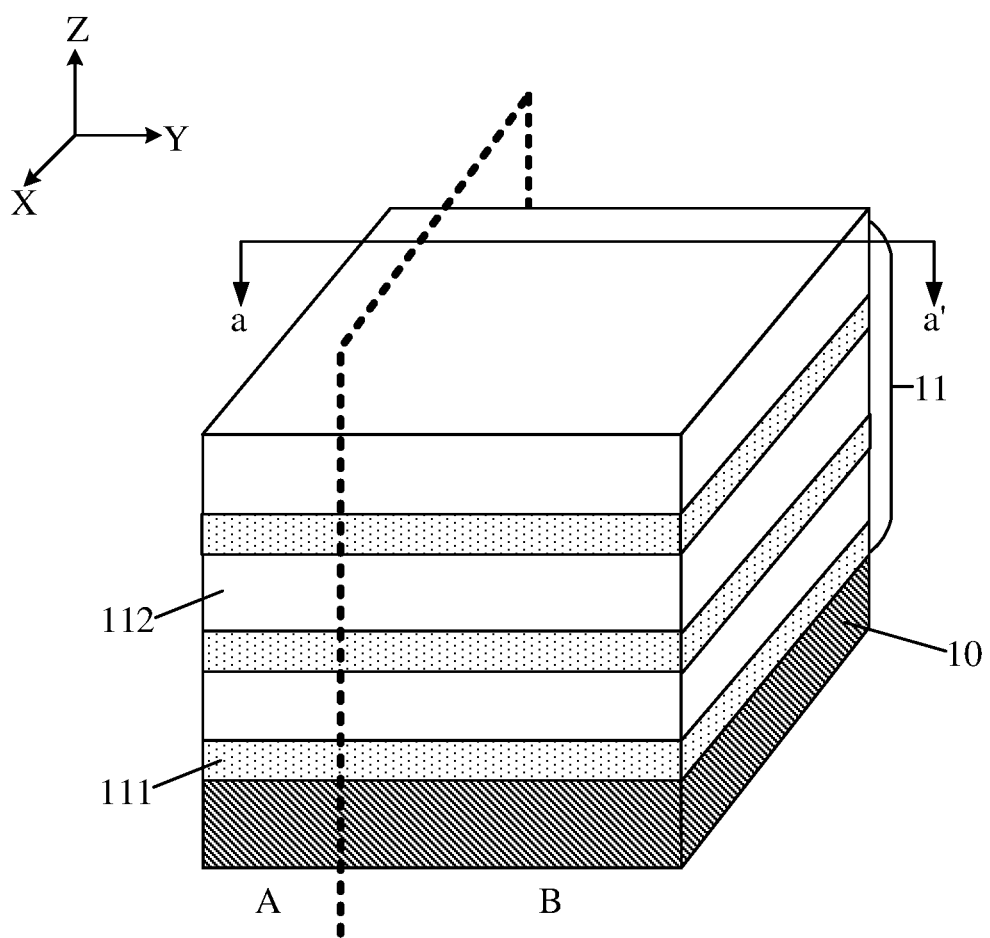
FIG. 2A to FIG. 2L and FIG. 3A to FIG. 3K schematically illustrate structures during the process for forming the semiconductor structure provided by the embodiments of the disclosure.

First, step S101 may be performed to provide a semiconductor structure with reference to FIG. 2A to FIG. 2G. The semiconductor structure includes a first region A and a second region B arranged in sequence along a Y-axis direction. The second region B includes active structures arranged in an array along an X-axis direction and a Z-axis direction. The active structure at least includes a channel structure 18. FIG. 2A shows a three-dimensional view. FIG. 2B to FIG. 2G show top views in the process for forming the semiconductor structure or sectional views along a-a' in the process for forming the semiconductor structure.

In some embodiments, the channel structure 18 may be formed by the following operations. A stacked structure 11 is formed on a surface of the semiconductor substrate 10, and includes first semiconductor layers 111 and second semiconductor layers 112 alternately stacked along the third direction. The stacked structure 11 and part of the semiconductor substrate 10 are etched to form first isolation grooves 12 and second isolation grooves 13 located in the second region B, extending along the second direction and arranged alternately at intervals, and a etched trench 14 located in the first region A and extending along the first direction. The stacked structure 11 remaining in the second region B is processed to form the channel structure 18.

Figure 2B:
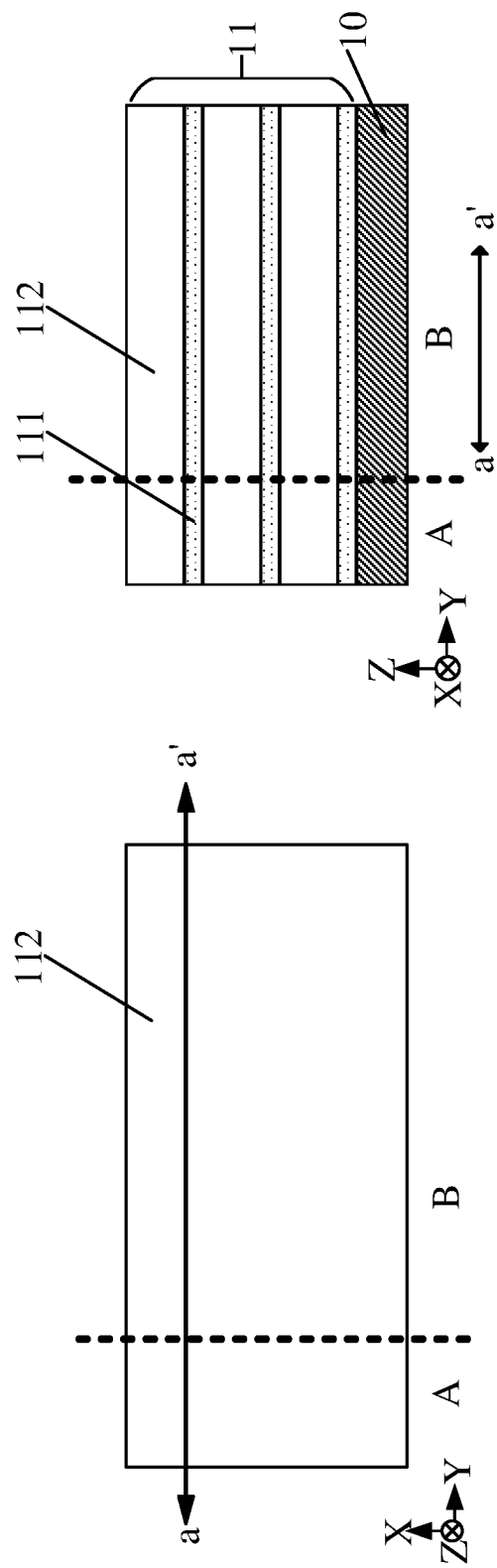

As shown in FIG. 2A and FIG. 2B, the stacked structure 11 located in the first region A and the second region B is formed on the surface of the semiconductor substrate 10. The stacked structure 11 includes the first semiconductor layers 111 and the second semiconductor layers 112 alternately stacked along the Y-axis direction.

In the embodiments of the disclosure, the material of the first semiconductor layer 111 may be germanium (Ge), silicon germanium (SiGe) or silicon carbide, or may also be a Silicon-On-Insulator (SOI) or a Germanium-on-Insulator (GOI). The second semiconductor layer 112 may be a silicon layer, or may also include other semiconductor elements such as germanium, or include semiconductor compounds such as silicon carbide, gallium arsenide, gallium phosphide, indium phosphide, indium arsenide or indium antimonide, or include other semiconductor alloys such as silicon germanium, arsenic gallium phosphide, indium aluminum arsenide, gallium aluminum arsenide, indium gallium arsenide, indium gallium phosphide, and/or indium gallium arsenide phosphate, or a combination thereof.

In the embodiments of the disclosure, the first semiconductor layer 111 and the second semiconductor layer 112 have different materials, because the first semiconductor layer 111 in the stacked structure 11 needs to be removed and the second semiconductor layer 112 needs to be remained subsequently. Therefore, the first semiconductor layer 111 has a greater etching selectivity relative to the second semiconductor layer 112. For example, the etching selectivity of the first semiconductor layer 111 relative to the second semiconductor layer 112 may be 5 to 15, so that the first semiconductor layer 111 is etched and removed more easily relative to the second semiconductor layer 112 during etching.

In the embodiments of the disclosure, the number of the first semiconductor layers 111 and the second semiconductor layers 112 in the stacked structure 11 may be set according to the required capacitance density (or storage density). The greater the number of the first semiconductor layers 111 and the second semiconductor layers 112, the higher the integration degree of the formed semiconductor structure and the greater the capacitance density.

In the embodiments of the disclosure, the first semiconductor layers 111 and the second semiconductor layers 112 may be formed by any one of the following deposition processes: an epitaxial process, a Chemical Vapor Deposition (CVD) process, a Physical Vapor Deposition (PVD) process, an Atomic Layer Deposition (ALD) process, a spin coating process, a coating process, or a thin film process. For example, the first semiconductor layers 111 and the second semiconductor layers 112 may be formed on the semiconductor substrate 10 in sequence by the epitaxial process.

Figure 2C:
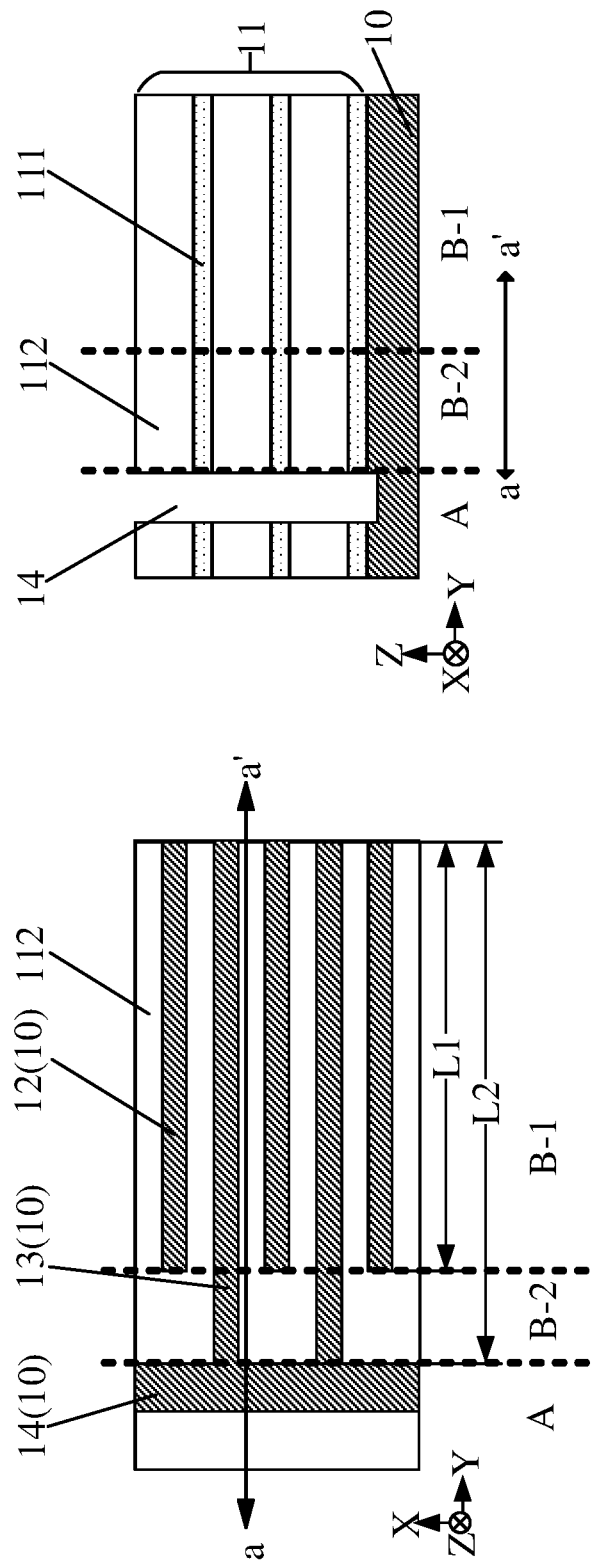

As shown in FIG. 2C, the stacked structure 11 and part of the semiconductor substrate 10 are etched to form first isolation grooves 12 and second isolation grooves 13 located in the second region B, extending along the Y-axis direction and arranged alternately at intervals, and a etched trench 14 located in the first region A and extending along the X-axis direction. The first isolation grooves 12, the second isolation grooves 13, and the etched trench 14 all expose the semiconductor substrate 10. The dimension L1 of the first isolation groove 12 along the Y-axis direction is smaller than the dimension L2 of the second isolation groove 13 along the Y-axis direction, and the second isolation grooves 13 are communicated with the etched trench 14.

In the embodiments of the disclosure, the stacked structure 11 remaining in the second region is defined as a first part B-1 and a second part B-2. The first part B-1 is located on either side of the first isolation groove 12 along the first direction, and the second part B-2 is connected to the first part B-1 along the second direction.

In the embodiments of the disclosure, the first isolation groove 12 may be in a shape of rectangular.

In other embodiments, the first isolation groove 12 may also be L-shaped.

In the embodiments of the disclosure, the stacked structure 11 and part of the semiconductor substrate 10 may be etched by a wet etching process (for example, etching by using strong acids such as concentrated sulfuric acid, hydrofluoric acid, and concentrated nitric acid) or a dry etching process (such as a plasma etching process, a reactive ion etching process, or an ion milling process).

As shown in FIG. 2D to FIG. 2G, the operation that the stacked structure 11 remaining in the second region B is processed to form the channel structure 18 may include the following operations. A first isolation layer 15 is formed in the first isolation groove 12, the second isolation groove 13, and the etched trench 14. The surface of the first isolation layer 15 is flush with the surface of the stacked structure 11. A first mask layer 161 with a preset pattern E is formed on the surfaces of the stacked structure 11 and the first isolation layer 15. The preset pattern E exposes part of the first isolation layer 15 located in the etched trench and part of the stacked structure 11 in the second part B-2. The first mask layer 161 located in the second region B (the first part B-1 and the second part B-2) is flush with both sides of the first isolation groove along the second direction, and the projection of the first mask layer 161 located in the first region A along the Z-axis direction are partially overlapped with the projection of the etched trench in the Z-axis direction. The exposed part of the first isolation layer 15 and the first semiconductor layer 111 in the exposed second part B-2 are removed through the first mask layer 161, so as to form a gate trench 17. The second semiconductor layer 112 remaining in the exposed second part B-2 forms the channel structure 18.

Figure 2D:
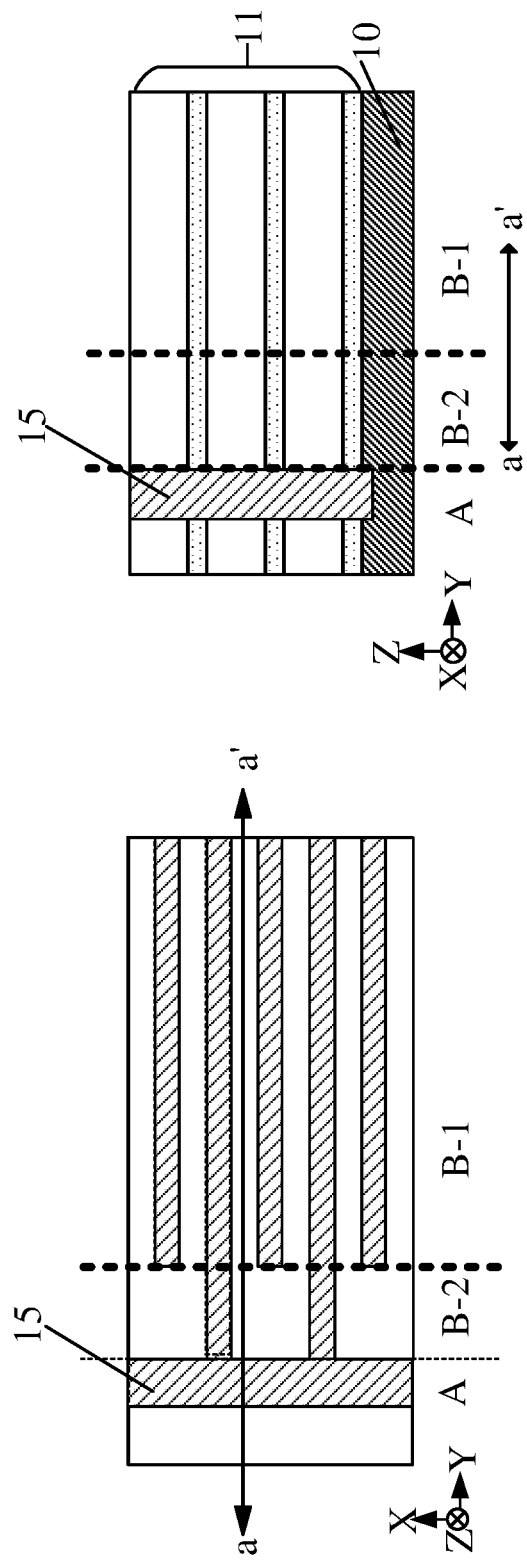

As shown in FIG. 2D, the first isolation groove, the second isolation groove, and the etched trench are filled with a first isolation material to form a first isolation layer 15. The surface of the first isolation layer 15 is flush with the surface of the stacked structure 11. The first isolation material may be silicon oxide, silicon nitride, silicon oxynitride, etc.

Figure 2E:
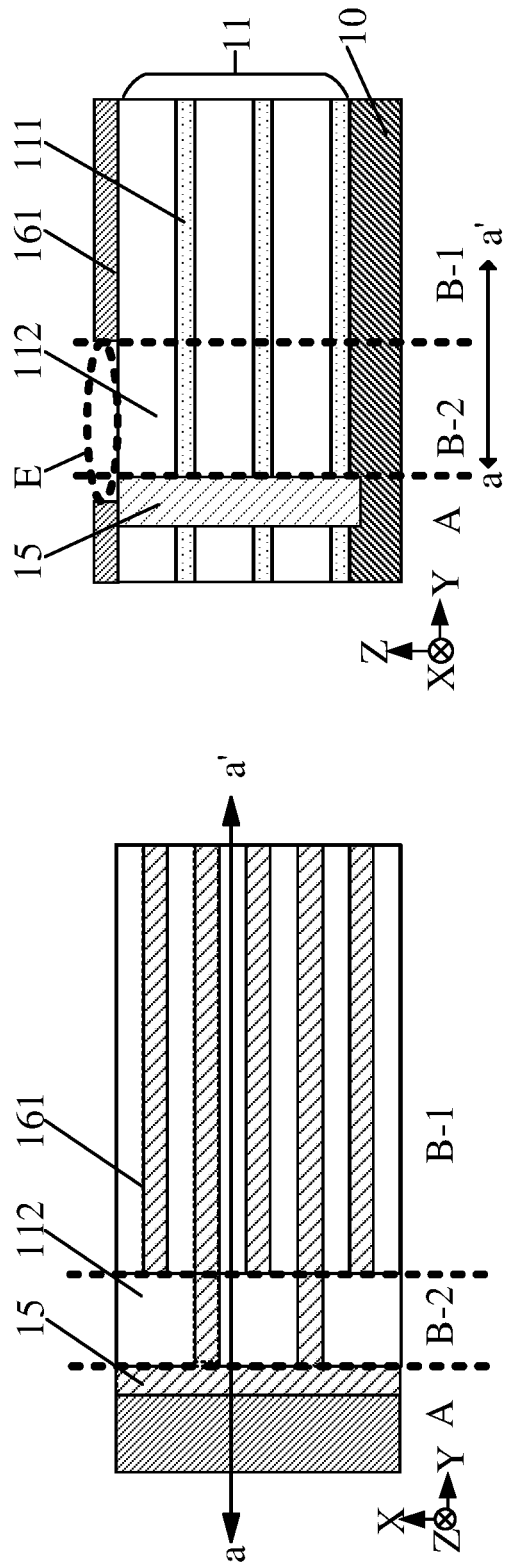

As shown in FIG. 2E, the first mask layer 161 with the preset pattern E is formed on the surfaces of the stacked structure 11 and the first isolation layer 15. The preset pattern E exposes part of the first isolation layer 15 located in the etched trench, and exposes the stacked structure 11 in the second part B-2. The first mask layer 161 is flush with both sides of the first isolation groove along the Y-axis direction.

In the embodiments of the disclosure, the material of the first mask layer 161 may be one or more of silicon oxide, silicon nitride, silicon carbide, and silicon oxynitride. The first mask layer 161 may be formed by any suitable deposition process.

Figure 2F:
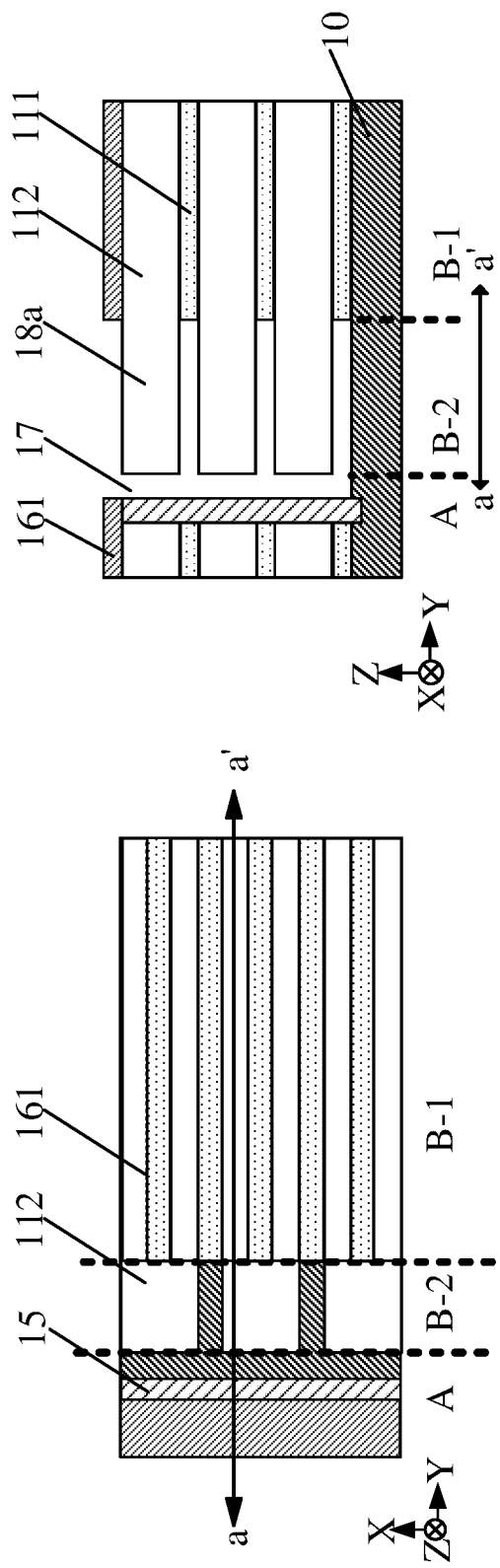

As shown in FIG. 2F, the exposed first isolation layer 15 in the first part B-1 and the first semiconductor layer 111 in the second part B-2 are sequentially removed by the first mask layer 161, so as to form the gate trench 17. The second semiconductor layer 112 remaining in the second part B-2 forms a channel structure 18a.

In the embodiments of the disclosure, the exposed part of the first isolation layer 15 and the first semiconductor layer 111 in the second part B-2 may be removed by a dry etching process or a wet etching process. The gas used in dry etching may be one or any combination of trifluoromethane ($CHF_3$), carbon tetrafluoride ($CF_4$), difluoromethane ($CH_2F_2$), hydrobromic acid (HBr), chlorine ($Cl_2$) or sulfur hexafluoride ($SF_6$).

Figure 2G:
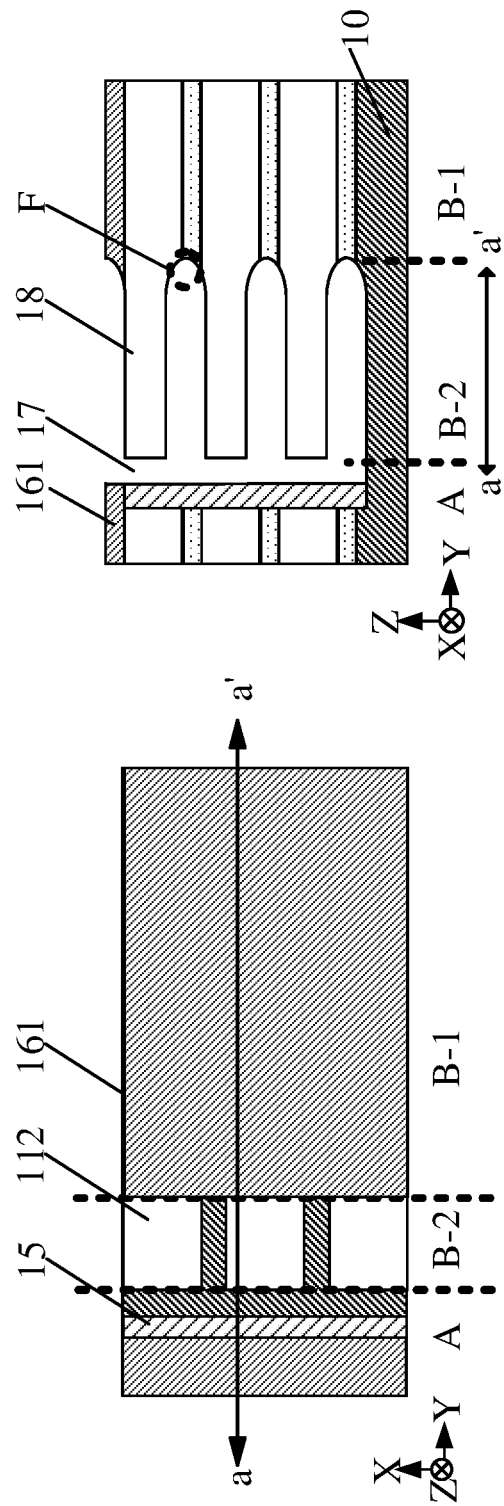

In some embodiments, the method for forming the semiconductor structure further includes the following operations. Thinning processing is performed on the channel structure 18a, and the thinning processed structure can also be used as the channel structure 18 in the embodiments of the disclosure (as shown in FIG. 2G). For example, the channel structure 18a may be subjected with the thinning processing through the following two modes.

Mode 1: dry etching is performed directly on the channel structure 18a, and the etching is stopped until a desired thickness is formed.

Mode 2: the channel structure 18a is oxidized in situ to oxidize part of the channel structure 18a into a silicon oxide layer, and then the silicon oxide layer is removed by a wet etching or dry etching technology.

It should be noted that there is a filleted corner F at a junction between the channel structure 18a and the first part B-1 during thinning the channel structure 18a. In Mode 1, the formation of the filleted corner F is caused by the fact that residues are not completely removed during thinning In Mode 2, the formation of the filleted corner F is caused by the fact that the oxidation rates of silicon of different crystal phases are different when the channel structure 18a is oxidized, and that the filleted corner is located in the innermost part when the silicon oxide layer is removed, the silicon oxide inside is etched unevenly by etching gas flow.

In the embodiments of the disclosure, a channel structure formed of a fully depleted semiconductor layer may be formed by performing thinning processing on the channel structure. By this way, holes are easily recombined in a source area instead of accumulating, so the floating body effect can be improved. In addition, since the gap between two adjacent channel structures becomes larger, a larger space may be reserved for the subsequent formation of the gate structure, which reduces the manufacturing process complexity and the manufacturing cost of the gate structure.

It is to be noted that, in other embodiments, the channel structure 18a may also not be subjected with the thinning processing.

Next, with reference to FIG. 2H to FIG. 2L and FIG. 3A to FIG. 3K, step S102 and step S103 are performed to form a gate structure 30 on the surface of the channel structure 18, and form a word line structure 22 extending in the X-axis direction on the first region A. The word line structure 22 is connected with the gate structure 30 located on the same layer.

In the embodiments of the disclosure, the gate structure 30 may be formed by the following operations. A gate dielectric layer 171 and a gate conductive layer 172 covering the channel structure 18 are sequentially formed on an inner wall of the gate trench 17, so as to form an initial gate structure 29. A second isolation layer 19 is formed in the gate trench 17 having the gate dielectric layer 171 and the gate conductive layer 172. A surface of the second isolation layer 19 is flush with the surface of the stacked structure 11. The first isolation layer 15 remaining in the etched trench 14, and the gate dielectric layer 171 and the gate conductive layer 172 located on the side wall of the second isolation layer 19 in the gate trench 17 are removed to expose part of the etched trench 14. A third isolation layer 20 is formed on the exposed etching trench 14. The stacked structure 11 in the first region A, as well as the second isolation layer 19 and the third isolation layer 20 in the etched trench 14 are processed to form a word line structure 22. The initial gate structure 29 is processed to form the gate structure 30.

Figure 2H:
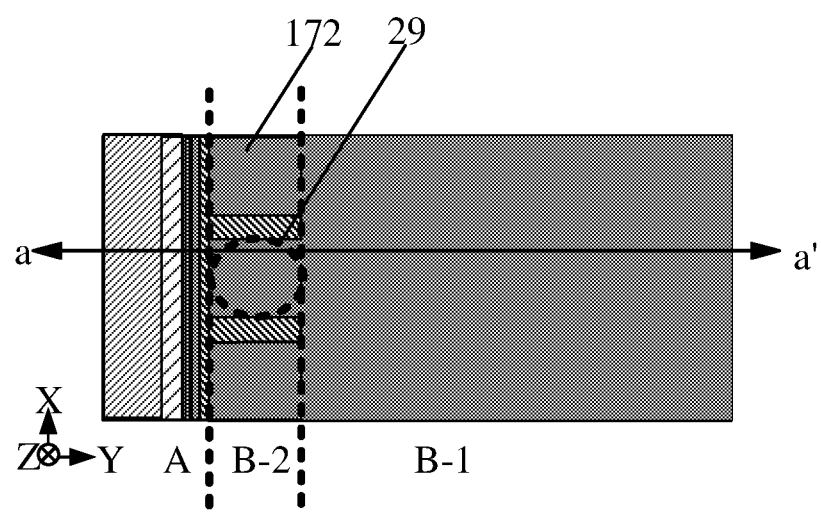
Figure 2I:
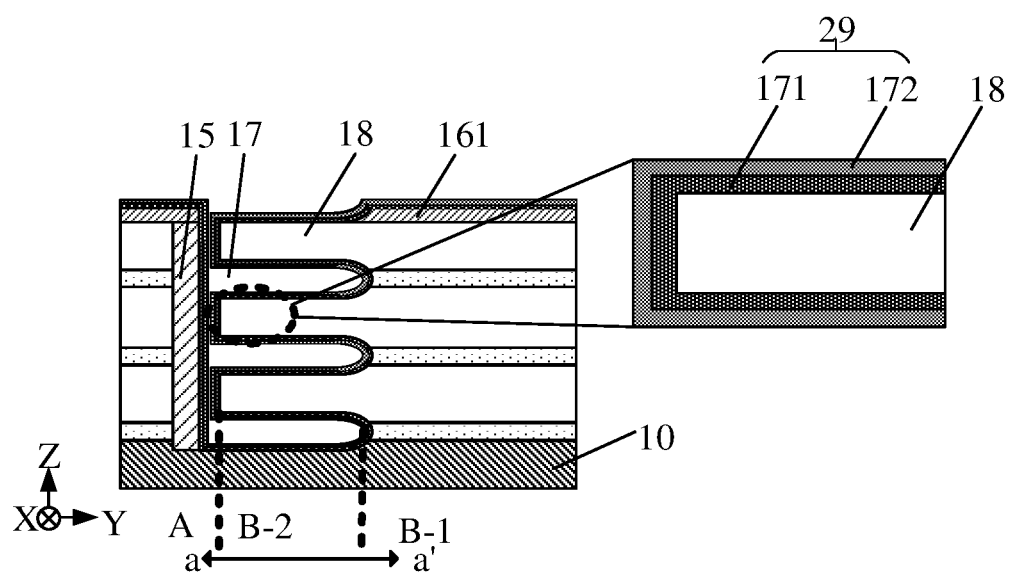

As shown in FIG. 2H and FIG. 2I, a gate dielectric material and a gate conductive material are deposited on the inner wall of the gate trench 17 to form the gate dielectric layer 171 and the gate conductive layer 172 covering the channel structure 18, so as to form the initial gate structure 29.

In the embodiments of the disclosure, the gate dielectric material may be silicon oxide or other suitable materials. The gate conductive material may include one or any combination of polysilicon, metal (e.g., tungsten, copper, aluminum, titanium, tantalum, ruthenium, etc.), metal alloy, metal silicide, titanium nitride, etc.

In the embodiments of the disclosure, the gate dielectric layer 171 and the gate conductive layer 172 may be formed by any suitable deposition process, such as the chemical vapor deposition process, a physical vapor deposition process, an atomic layer deposition process.

It is worth noting that during the formation of an initial gate, the gate dielectric material and the gate conductive material are not only deposited on the inner wall of the gate trench 17, but also deposited on the side wall of the first isolation layer 15 and the surface of the first mask layer 161.

Figure 2J:
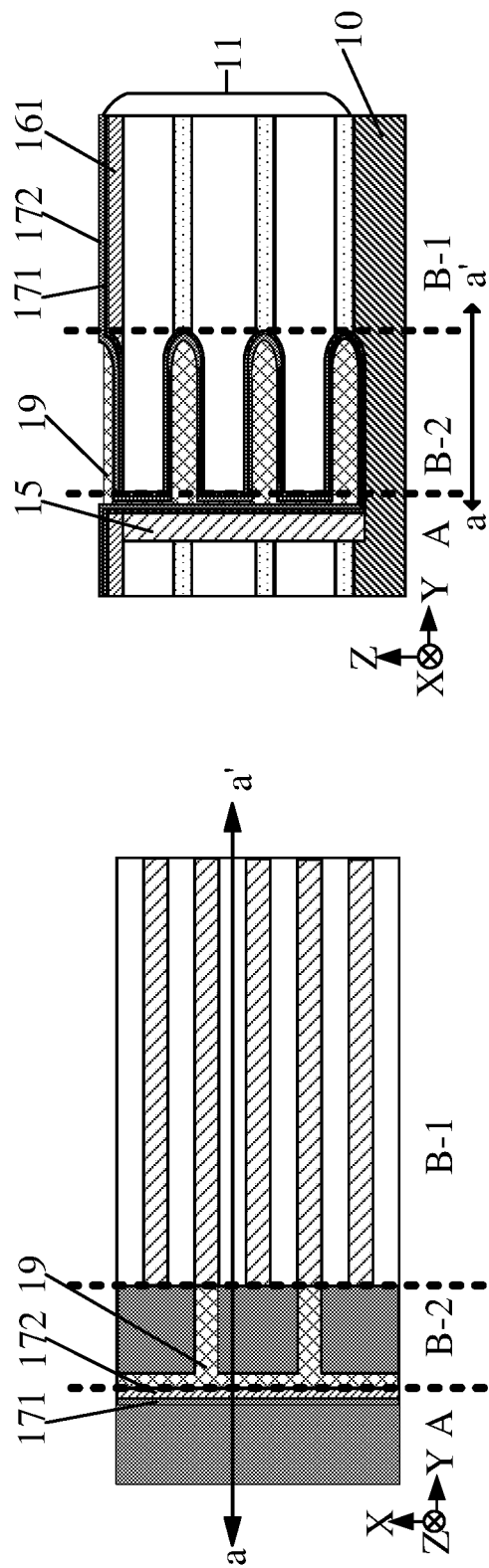

As shown in FIG. 2J, the gate trench having the gate dielectric layer 171 and the gate conductive layer 172 is filled with the second isolation material to form the second isolation layer 19. The surface of the second isolation layer 19 is flush with the surface of the stacked structure 11.

In the embodiments of the disclosure, the second isolation material may be a material with low-dielectric constant (Low K), such as SiCON. When using the Low K material as an isolation material, the insulation performance is good, so that the gate leakage in a current leakage path can be reduced, thereby improving the performance of the semiconductor structure.

In the embodiment of the disclosure, after forming the second isolation layer 19, the method for forming the semiconductor structure further includes an operation of removing the first mask layer 161, and the gate dielectric material and the gate conductive material located on the surface and sidewall of the first mask layer 161.

Figure 2K:
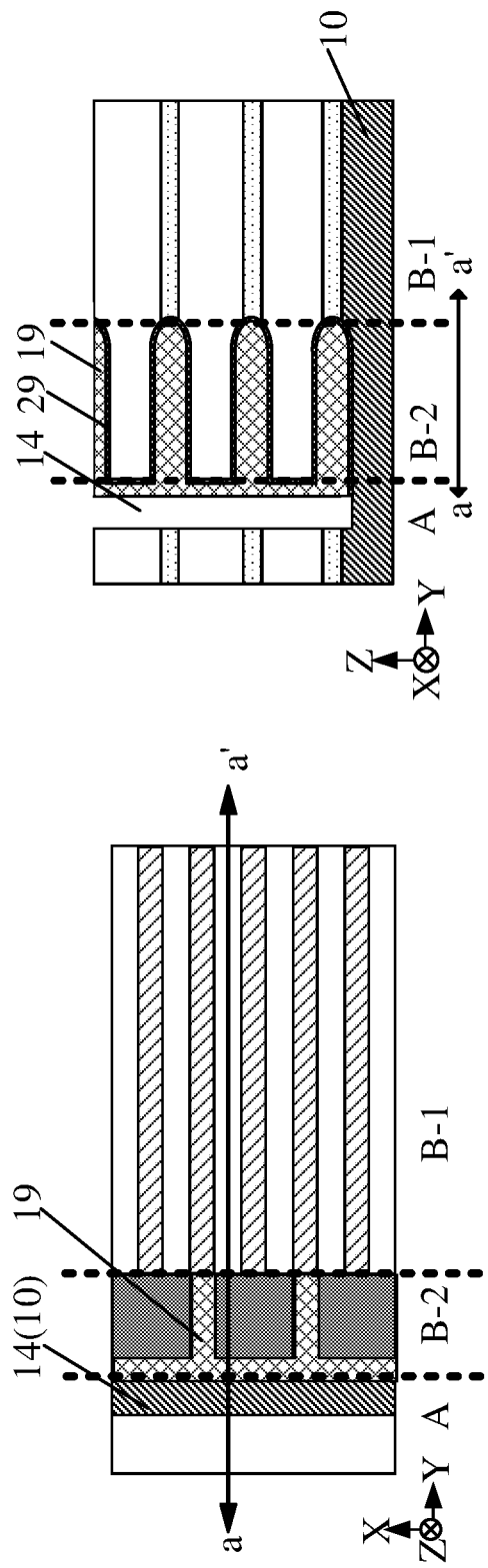

As shown in FIG. 2K, the first isolation layer remaining in the etched trench 14 and the gate dielectric layer as well as the gate conductive layer located on the side wall of the first isolation layer in the gate trench are sequentially removed by a wet etching process or a dry etching process, so as to expose part of the etched trench 14.

Figure 2L:
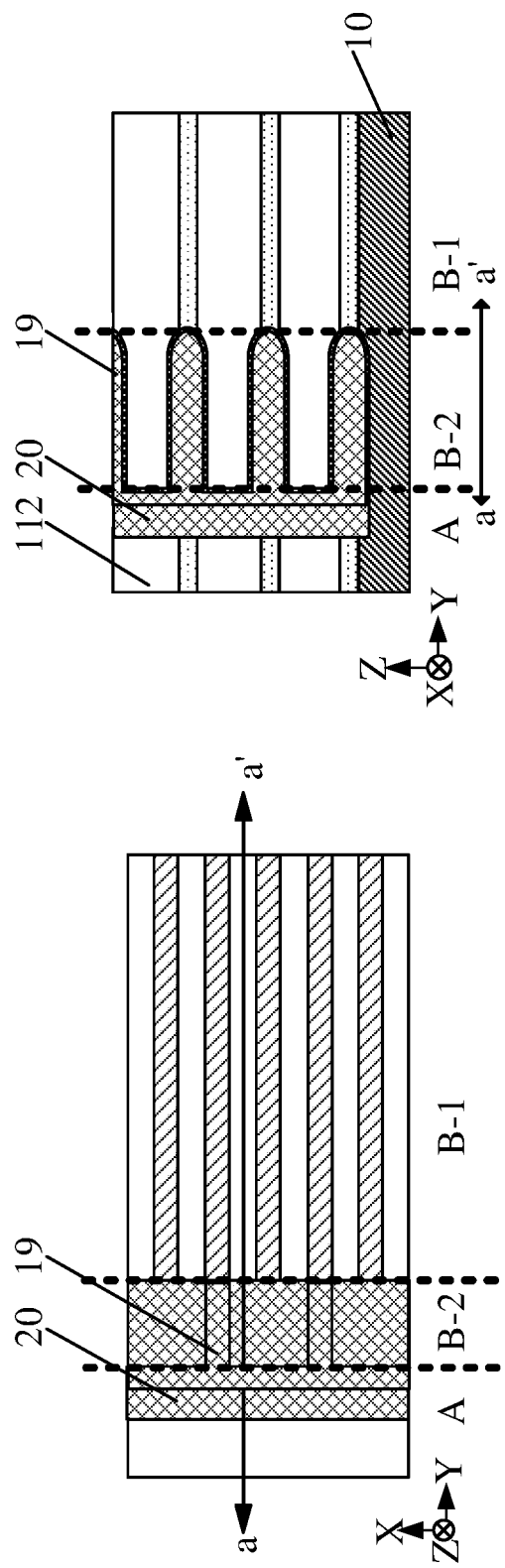

As shown in FIG. 2L, a third isolation layer is deposited in the exposed etched trench to form a third isolation layer 20. In the embodiments of the disclosure, the third isolation material may be a material with low-dielectric constant, such as SiCON.

When using the Low K material as an isolation material, the insulation performance is good, so that the line crosstalk between the word line structures formed subsequently can be reduced, thereby improving the performance of the semiconductor structure.

In some embodiments, the operation that the stacked structure 11 in the first region A as well as the second isolation layer 19 and the third isolation layer 20 in the etched trench 14 are processed to form the word line structure 22 may include the following operations: the second semiconductor layer 112 in the first region A, as well as the third isolation layer 20 and the second isolation layer 19 located in the projection area of the second semiconductor layer 112 along the second direction are sequentially removed to form the word line trench. The word line trench 21 is filled with a word line metal material to form the word line structure 22.

Figure 3A:
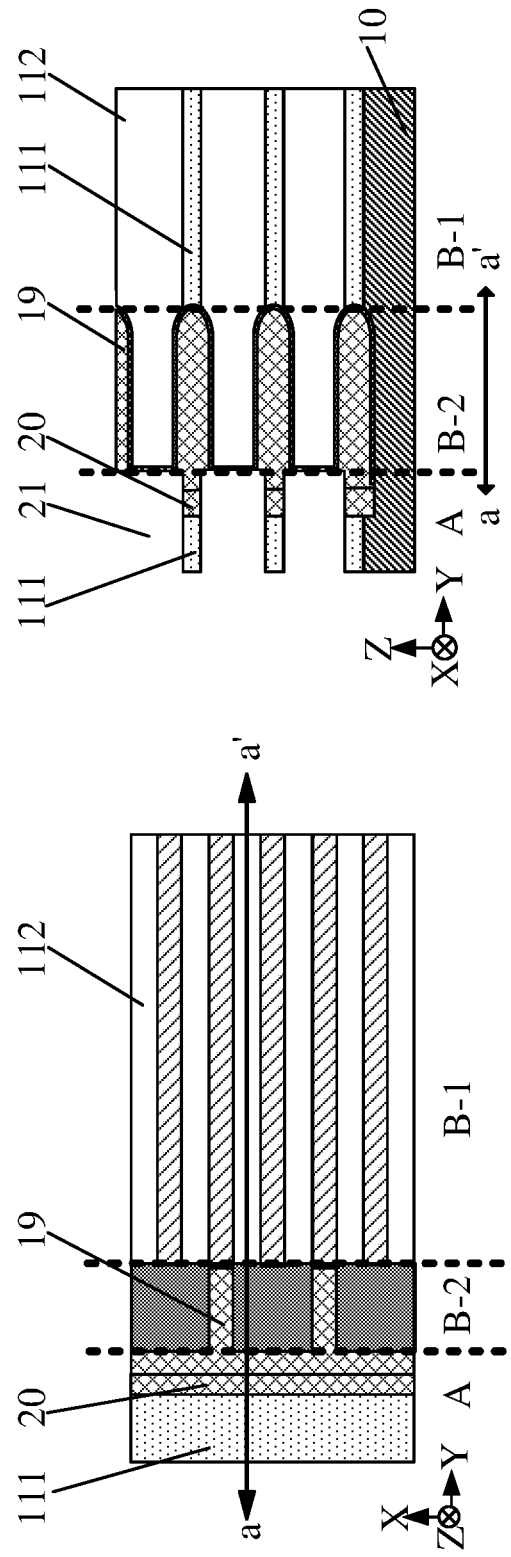

As shown in FIG. 3A, a self-aligned process is used to remove the second semiconductor layer 112 in the first region A to form a self-aligned opening. Then, by using the remaining first semiconductor layer 111 in the first region A as a mask, the third isolation layer 20 located in the projection area of the second semiconductor layer 112 along the Y axis direction and located in the first region A, as well as the second isolation layer 19 located in the projection area of the second semiconductor layer 112 along the Y axis direction and located in the first region A are removed to form a word line trench 21.

In the embodiments of the disclosure, by using self-aligned transverse etching, the number of photomasks used in the formation of the word line trench 21 can be decreased, and the cost and the process complexity for manufacturing the word line structure can be reduced, thereby reducing the manufacturing cost and the manufacturing process complexity of the finally formed semiconductor structure.

Figure 3B:
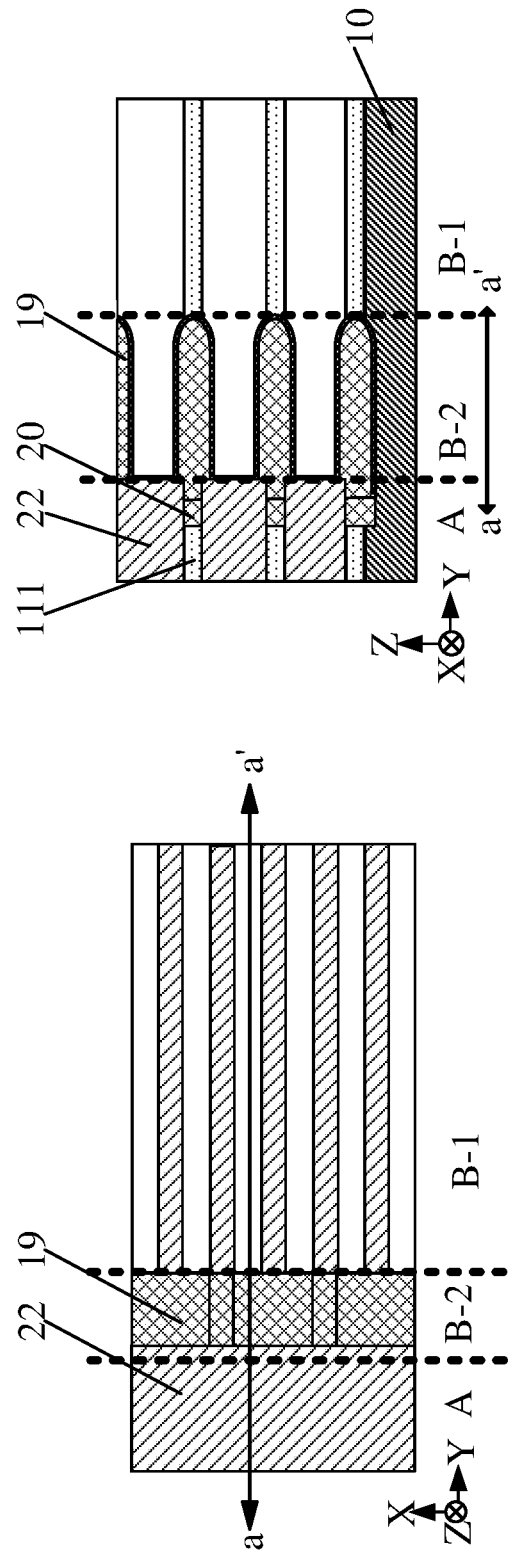

As shown in FIG. 3B, the word line trench 21 is filled with a word line metal material to form the word line structure 22. The word line metal material may be cobalt (Co), titanium (Ti), tantalum (Ta), nickel (Ni), tungsten (W), platinum (Pt), palladium (Pd) or any other suitable conductive metal material. The word line structure 22 may be formed by any suitable deposition process.

In the embodiments of the disclosure, the formed word line structure is horizontal, and the horizontal word line structure may be directly formed by filling, which reduces the complexity of the manufacturing process of the horizontal word line structure, thereby reducing the manufacturing cost of the semiconductor structure. In addition, the word line structure formed by a word line side connection method not only realizes the interconnection of word line structures on the same plane of the multi-layer stacked structures, but also controls the dimension of the side connected word lines, thereby realizing the control of a word line coupling effect by controlling the dimension of the side connected word lines.

Figure 3C:
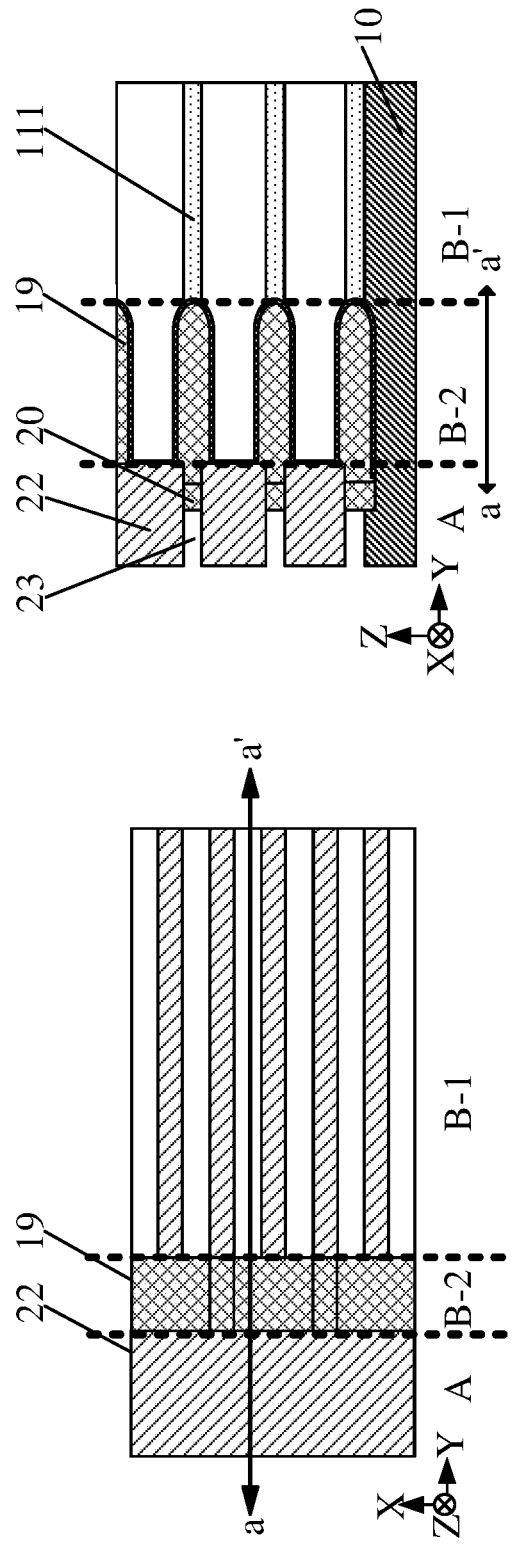
Figure 3D:
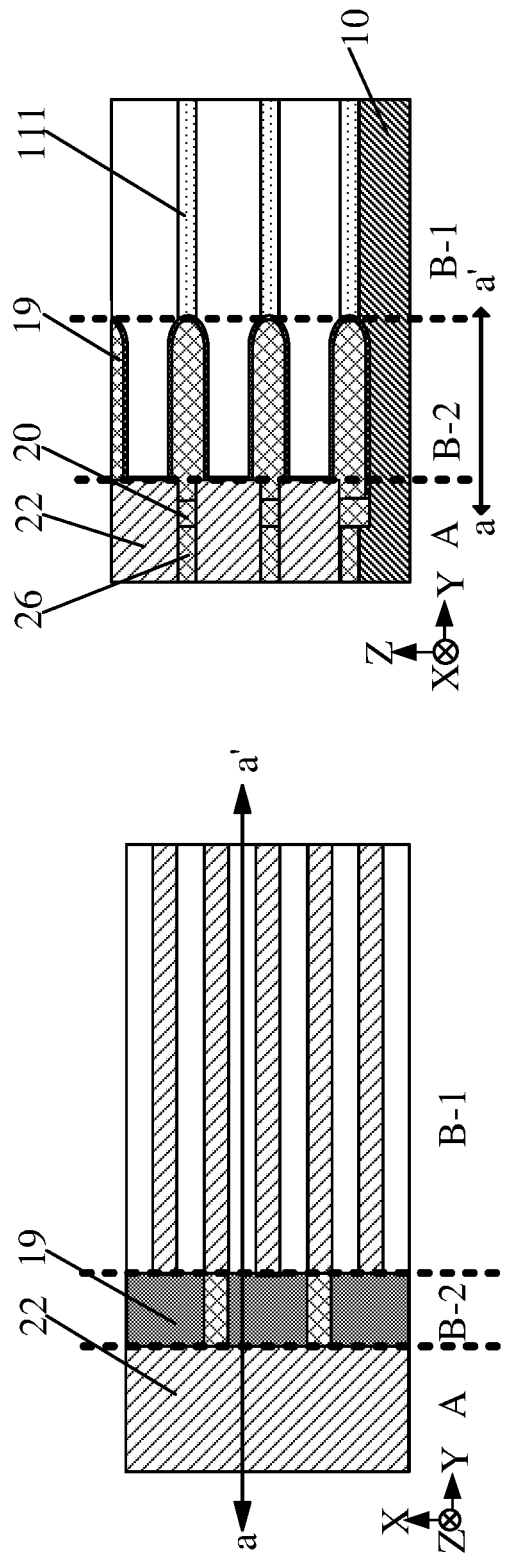
Figure 3E:
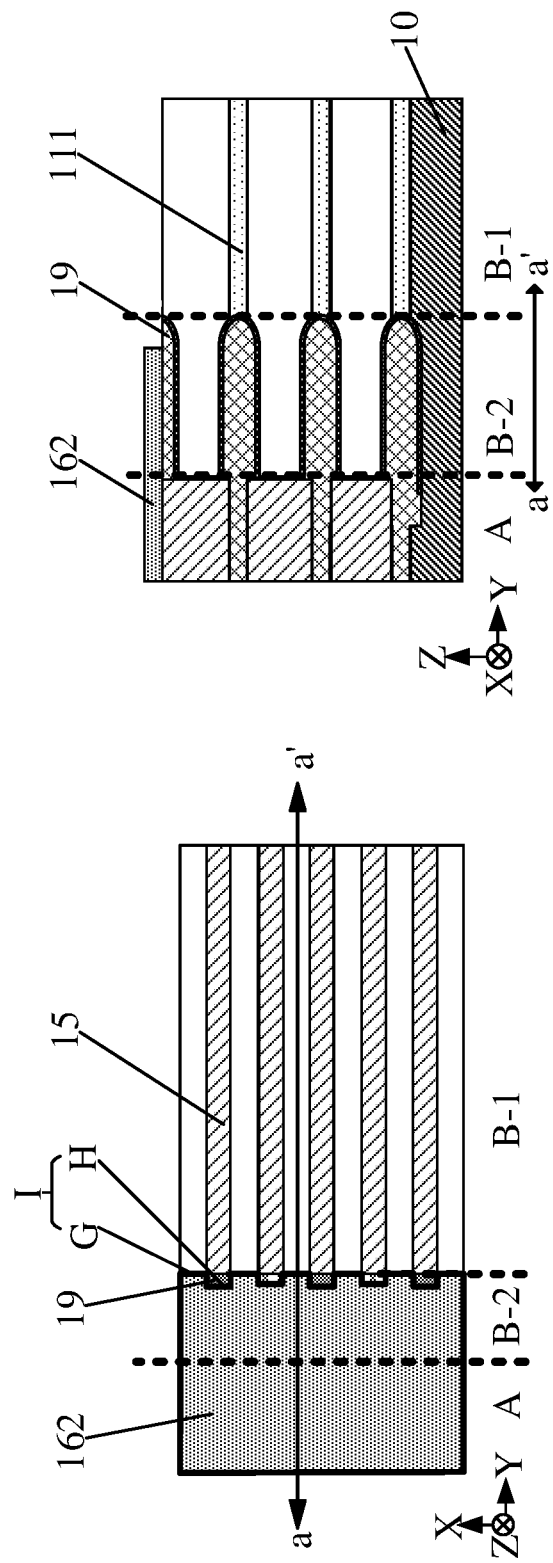

In some embodiments, as shown in FIG. 3C and FIG. 3D, after the word line structure 22 is formed, the method further includes an operation of removing the first semiconductor layer 111 in the first region A to form the third isolation groove 23, and an operation of filling the third isolation groove 23 with a fourth isolation material to form a fourth isolation layer 26.

In the embodiments of the disclosure, the fourth isolation material may be a material with low-dielectric constant, such as SiCON. The fourth isolation layer 26 may be formed by any suitable deposition process.

In the embodiments of the disclosure, the first isolation material, the second isolation material, the third isolation material, and the fourth isolation material may all be the same, or any two of them may be the same, or they may all be different.

In some embodiments, the operation that the initial gate structure 29 is processed to form the gate structure 30 includes the following operations. A second mask layer 162 with a zigzag pattern is formed on surfaces of the word line structure 22 and the initial gate structure 2. The exposed initial gate structure 29 is removed through the second mask layer 162 to form the gate structure 30 and a first space c.

Figure 3F:
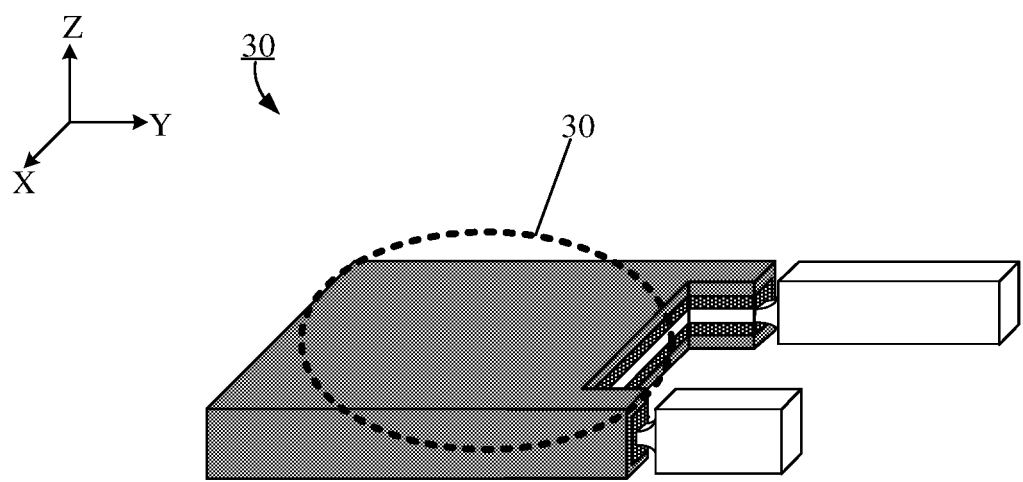

As shown in FIG. 3E to FIG. 3H, the second mask layer 162 with the zigzag pattern is formed on the surfaces of the word line structure 22 and the initial gate structure 29. The exposed initial gate structure 29 is removed through the second mask layer 162 to form the gate structure 30 and the first space c. FIG. 3F illustrates a three-dimensional view of a formed gate structure 30.

In the embodiments of the disclosure, the second mask layer 162 has a zigzag pattern. The zigzag pattern I includes convex patterns G and concave patterns H that are alternately arranged in sequence along the X-axis direction. The concave pattern H exposes part of the initial gate structure 29. The exposed initial gate structure 29 is removed by the second mask layer 162 to form the gate structure 30 as shown in FIG. 3F. In the embodiments of the disclosure, the gate structure 30 is a five-sided Gate-All-Around structure. The gate structure 30 covers a first surface and a second surface of the channel structure 18 along the Z-axis direction, a third surface and a fourth surface of the channel structure 18 along the X-axis direction, and a fifth surface of the channel structure 18 along the Y-axis direction. The word line structure 22 is connected with the gate structure 30 located on the fifth surface. In addition, a sixth surface of the channel structure 18 along the Y-axis direction is connected with the active pillar and is electrically connected with the bit line structure and the capacitor structure.

In the embodiments of the disclosure, the material of the second mask layer 162 may be one or more of silicon oxide, silicon nitride, silicon carbide, and silicon oxynitride. The second mask layer 162 may be formed by any suitable deposition process.

In some embodiments, the active pillar 25 is also formed while forming the gate structure 30.

Figure 3G:
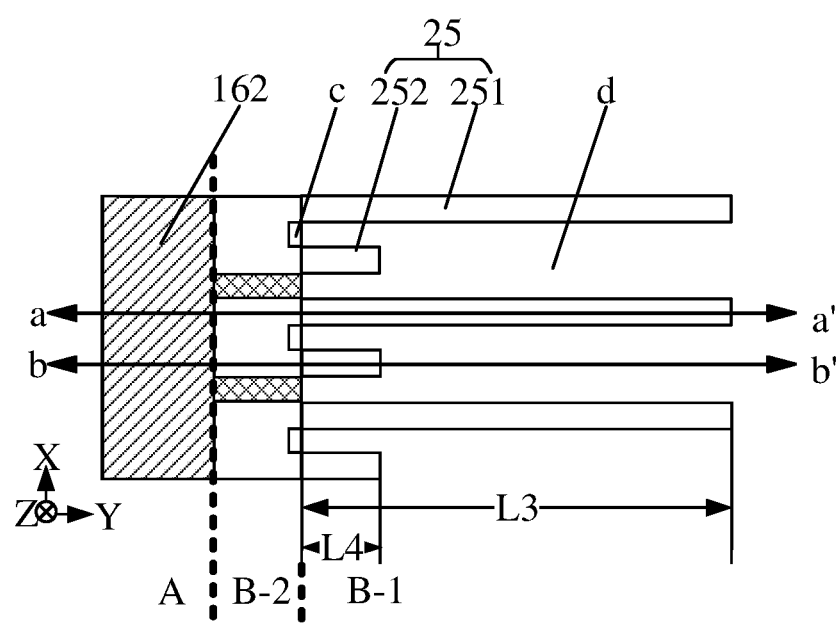
Figure 3H:
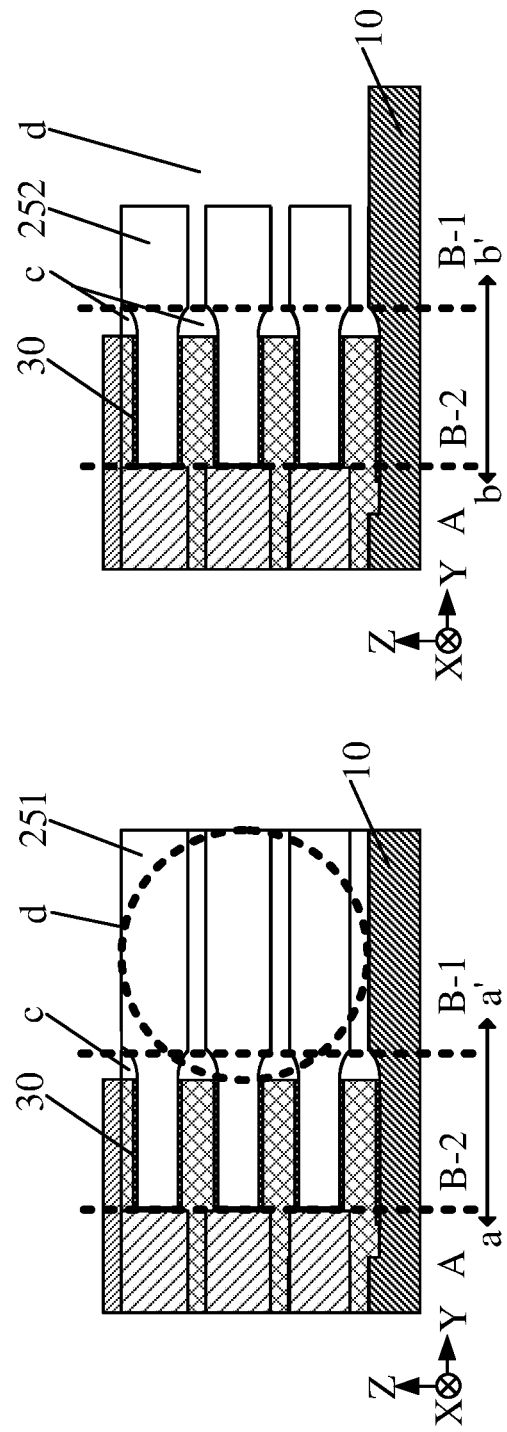

Continuing to refer to FIG. 3G to FIG. 3H, the second semiconductor layer 112 in the first part B-1 and the first isolation layer 15 located in the first part B-1 are removed to form a second space d as well as first sub-pillars 251 and second sub-pillars 252 alternately arranged at intervals along the X-axis direction. The first sub-pillars 251 and the second sub-pillars 252 form the active pillars 25. The second space d includes the first space c.

In the embodiments of the disclosure, the length L3 of the first sub-pillar 251 along the Y-axis direction is greater than the length L4 of the second sub-pillar 252 along the Y-axis direction. The second sub-pillars 252 and the first sub-pillars 251 are alternately arranged along the first direction. In other embodiments, the lengths of the first sub-pillars 251 and the second sub-pillars 252 may also be the same.

In the embodiments of the disclosure, the exposed initial gate structure 29, and the first isolation layer 15 located in the first part B-1 may be removed by a dry etching process or a wet etching process, so as to form the gate structure 30, the first sub-pillars 251, and the second sub-pillars 252. The gas used in dry etching may be one or any combination of trifluoromethane, carbon tetrafluoride, difluoromethane, hydrobromic acid, chlorine, or sulfur hexafluoride.

In the embodiments of the disclosure, since the zigzag pattern of the second mask layer includes convex patterns and concave patterns alternately arranged in sequence along the first direction, the formed gate structure 30 is U-shaped, as shown in FIG. 3F.

In other embodiments, when the dimension of the concave pattern of the zigzag pattern of the second mask layer along the second direction is decreased to 0, that is, when the second mask layer does not have a zigzag pattern, a gate structure with a rectangular projection along the Z-axis direction may also be formed.

The gate structure 30 provided by the embodiments of the disclosure may also be a five-sided Gate-All-Around structure. The five-sided Gate-All-Around structure has a larger channel area. In one aspect, the control over the gate can be enhanced, so that the dimension of the gate structure can be further reduced, thereby overcoming the limitations to physical scaling and performance in the conventional technology. In another aspect, the dimension of the gate structure can be further reduced due to the five-sided Gate-All-Around structure, so the dimension of a semiconductor structure can be further reduced.

In the embodiments of the disclosure, after the gate structure 30 is formed, the method for forming the semiconductor structure further includes an operation of removing the second mask layer 162.

In some embodiments, after the second mask layer is removed, the method for forming the semiconductor structure may further include an operation of forming word line steps sequentially stacked along the third direction. Each layer of the word lines in the word line steps is electrically connected with a corresponding gate structure arranged along the first direction.

In the embodiments of the disclosure, the word line step may be formed by the following two modes. Mode 1: firstly, a photoresist layer with a first opening is formed in a surface of the first region A, the first opening exposes one end, far away from the gate structure, of the first region A, the first region A is etched through the photoresist layer with the first opening to form a first step structure; secondly, a photoresist layer with a second opening is formed on a surface of the first step structure, the second opening exposes part of the first step structure, the first step structure is etched through the photoresist layer with the second opening to form a second step structure, herein the dimension of the second opening along the first direction is greater than the dimension of the first opening; thirdly, a photoresist layer with a third opening is formed on a surface of the second step structure, the third opening exposes part of the second step structure, and the second step structure is etched through the photoresist layer with the third opening to form a third step structure, herein the dimension of the third opening along the first direction is greater than the dimension of the second opening. The abovementioned operations are performed cyclically. Therefore, after multiple etching processes, the word line step is finally formed with a decreasing length layer by layer from bottom to top along the Z-axis direction.

Mode 2: firstly, a first word line with a first length is formed on the surface of the semiconductor substrate in the first region A, herein the first word line is electrically connected with a word line structure at the bottommost layer along the first direction; secondly, a first isolation unit with a second length is formed on a surface of the first word line, a second word line with the second length is formed on a surface of the first isolation unit, and the second word line is electrically connected with a second-layer word line structure at a sub-bottom layer along the first direction, herein the first length is greater than the second length, and the first isolation unit is configured to isolate adjacent first word line and second word line; thirdly, a second isolation unit with a third length is formed on a surface of the second word line, and a third word line with the third length is formed on a surface of the second isolation unit, herein the third word line is electrically connected with a third-layer word line structure from bottom to top along the first direction, herein the second length is greater than the third length, and the second isolation unit is configured to isolate adjacent second word line and third word line. The abovementioned operations are performed cyclically. Therefore, the word line step formed by a plurality of word lines is formed through multiple forming processes.

Figure 3I:
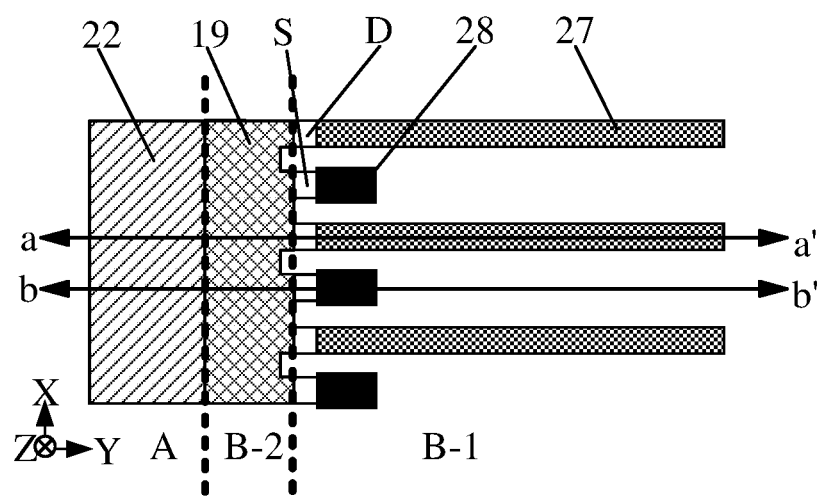

In some embodiments, before the capacitor structure 27 and the bit line structure 28 are formed, the method for forming the semiconductor structure further includes the following operations. Ion implantation is performed on the second semiconductor layer, close to the gate structure, in the second part B-2 to form a source S and a drain D (as shown in FIG. 3I). And a first contact structure and a second contact structure that are respectively in contact with the capacitor structure 27 and the bit line structure 28 are formed.

Figure 3J:
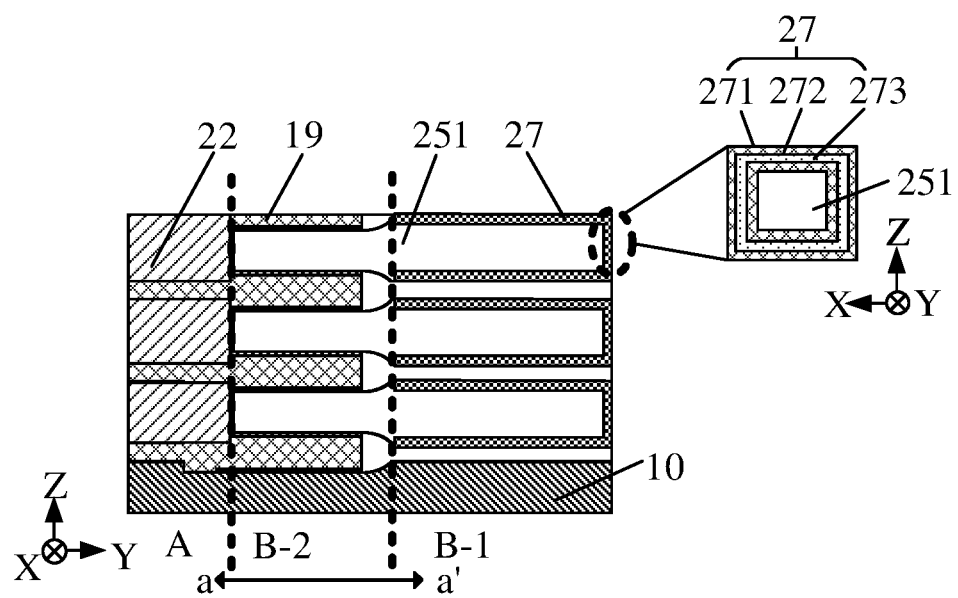
Figure 3K:
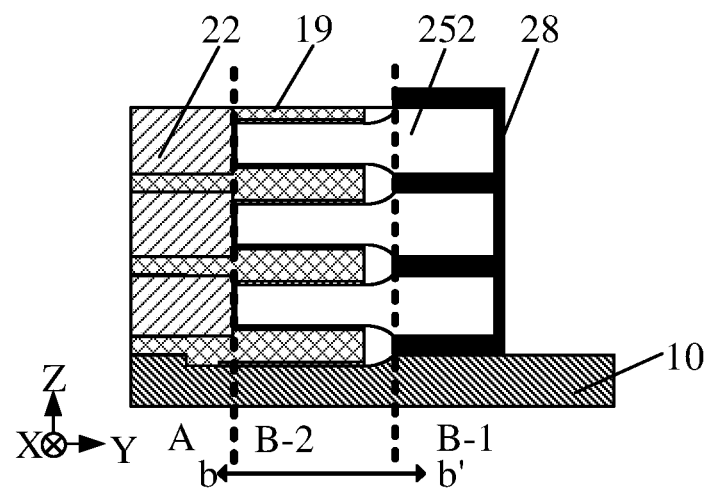

In some embodiments, referring to FIG. 3I to FIG. 3K, after the first sub-pillar 251 and the second sub-pillar 252 are formed, the method for forming the semiconductor structure further includes the following operations. A capacitor structure 27 is formed on an end face, away from the word line structure 22, of the first sub-pillar 251; and a bit line structure 28 is formed on an end face, away from the word line structure 22, of the second sub-pillar 252. The capacitor structure 27 extends along the second direction, and the bit line structure 28 extends along the third direction.

In the embodiments of the disclosure, the capacitor structure 27 may be formed by the following operations. A first electrode material, a dielectric material, and a second electrode material are sequentially deposited on the surface of the second sub-pillar 252, so as to form a first electrode layer 271, a dielectric layer 272, and a second electrode layer 273. The first electrode layer 271, the dielectric layer 272, and the second electrode layer 273 constitute the capacitor structure 27.

In the embodiments of the disclosure, the first electrode layer 271, the dielectric layer 272, and the second electrode layer 273 may be formed by any of the following deposition processes: a chemical vapor deposition process, a physical vapor deposition process, an atomic layer deposition process. The first electrode material and the second electrode material may include a metal nitride or a metal silicide, such as titanium nitride. The dielectric material may include a high-K dielectric material, for example, may be one or any combination of lanthanum oxide ($La_2O_3$), aluminum oxide ($Al_2O_3$), hafnium oxide ($HfO_2$), hafnium oxynitride (HfON), hafnium silicate ($HfSiO_x$) or zirconium oxide ($ZrO_2$) In other embodiments, the materials of the first electrode layer 271 and the second electrode layer 273 may also be polysilicon.

In some embodiments, before the first electrode layer 271 is formed, a metal silicide layer may also be formed on a surface of the first sub-pillar 251. During implementing, a layer of metal material, such as any of cobalt, titanium, tantalum, nickel, tungsten, platinum, and palladium (Pd), may be deposited on the surface of the first sub-pillar 251. After that, the metal material is reacted with the first sub-pillar 251 through rapid thermal annealing processing, so as to form a metal silicide on the surface of the first sub-pillar 251. The metal silicide has low resistance, so the contact resistance between the first electrode layer 271 and the drain can be reduced, thereby reducing the power consumption of the semiconductor structure.

In the embodiments of the disclosure, the formed capacitor structure extends along the Y-axis direction. That is, the formed capacitor structure is horizontal. Compared with a vertical capacitor structure with a large depth-to-width ratio, the horizontal capacitor structure can reduce the possibility of tipping or breaking, so that the stability of the capacitor structure can be improved. Moreover, a stack structure formed by stacking a plurality of capacitor structures in the Z-axis direction can form a three-dimensional semiconductor structure, so as to improve the integration degree of the semiconductor structure and realize miniaturization.

In the embodiments of the disclosure, referring to FIG. 3I to FIG. 3K, the bit line structure 28 may also be formed by the following step. A bit line metal material is deposited on an end face, away from the word line structure, of the second sub-pillar 252 to form the bit line structure 28.

In the embodiments of the disclosure, the bit line metal material may be any material with good conductivity, such as tungsten, cobalt, copper, aluminum, titanium, titanium nitride, platinum, palladium, molybdenum, a titanium-containing metal layer, polysilicon or any combination thereof.

In some embodiments, a metal silicide layer may also be formed between the second sub-pillar 252 and the bit line structure to reduce the contact resistance between the bit line structure 28 and the second sub-pillar 252, thereby further reducing the power consumption of the semiconductor structure.

In some embodiments, after the capacitor structure 27 and the bit line structure 28 are formed, the method for forming the semiconductor structure further includes an operation of forming a fifth isolation layer (not shown) in the second space.

In the embodiments of the disclosure, the material of the fifth isolation layer may be polysilicon or any other suitable materials.

The method for forming the semiconductor structure provided by the embodiments of the disclosure can realize the control to the length and the width of the gate. The formed word line structure is horizontal, and the horizontal word bit structure may be directly formed by filling, which reduces the complexity of a manufacturing process of the horizontal word line structure, thereby reducing the manufacturing cost of the semiconductor structure.

Figure 4A:
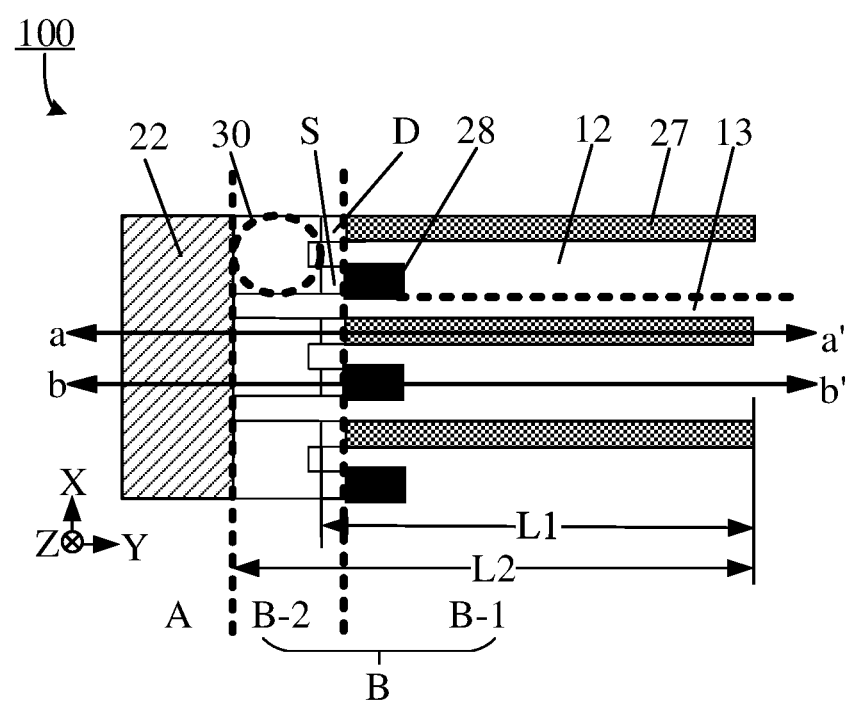
FIG. 4A to FIG. 4C schematically illustrate structures of the semiconductor structure provided by the embodiments of the disclosure.
Figure 4B:
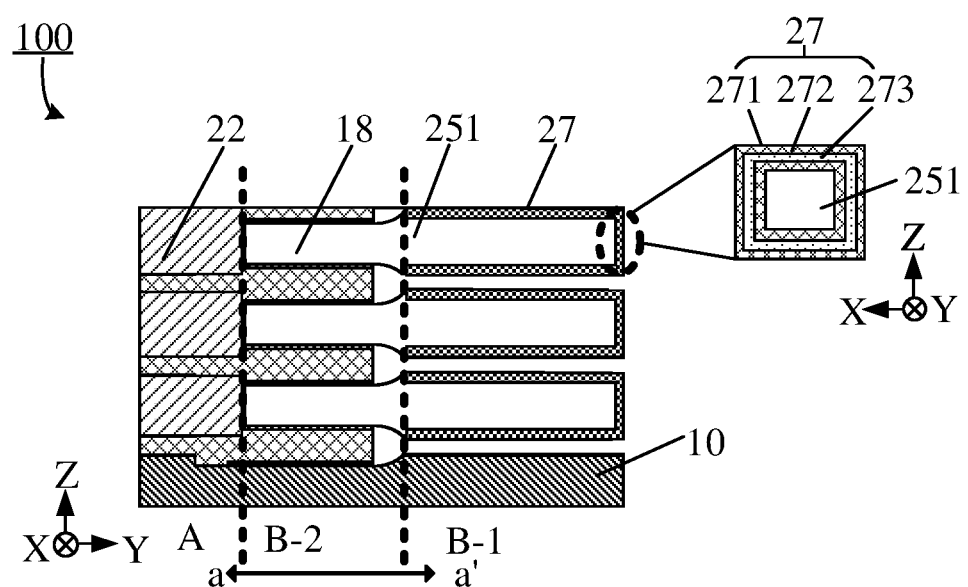
Figure 4C:
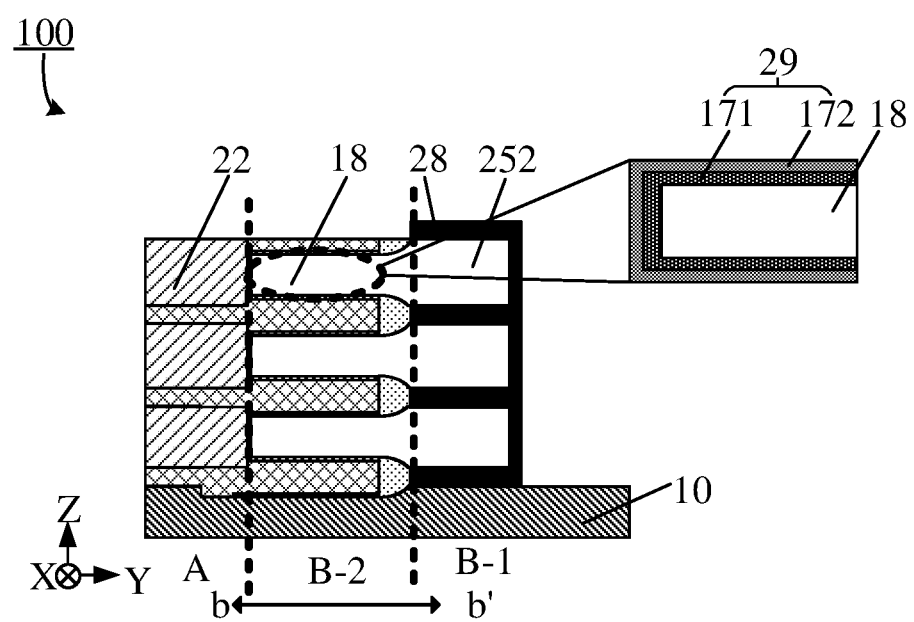

The embodiments of the disclosure further provide a semiconductor structure. FIG. 4A to FIG. 4C schematically illustrate structures of the semiconductor structure provided by the embodiments of the disclosure. As shown in FIG. 4A to FIG. 4C, the semiconductor structure 100 at least includes: a semiconductor substrate 10 including a first region A and a second region B arranged in sequence along the second direction (Y-axis direction); active structures located on the second region B, arranged in an array along the first direction (X-axis direction) and the third direction (Z-axis direction), and at least including a channel structure 18; a word line structure 22 located on the first region A and extending along the first direction; and a gate structure 30 located on a surface of the channel structure 18. The word line structure 22 is connected with the gate structure 30 located on the same layer. The second region B includes a first part B-1 and a second part B-2.

In some embodiments, the projection of the channel structure 18 on the surface of the semiconductor substrate 10 may be U-shaped. In other embodiments, the projection of the channel structure 18 on the surface of the semiconductor substrate 10 may be rectangular, L-shaped, or convex.

In some embodiments, continuing to refer to FIG. 4C, the gate structure 30 covers a first surface and a second surface of the channel structure 18 along the Z-axis direction, a third surface and a fourth surface of the channel structure 18 along the X-axis direction, and a fifth surface of the channel structure along the Y-axis direction. The word line structure 22 is connected with the gate structure 30 located on the fifth surface. The gate structure 30 includes a gate dielectric layer 171 and a gate conductive layer 172 that are stacked.

In some embodiments, continuing to refer to FIG. 4A, the semiconductor structure further includes a capacitor structure 27 and a bit line structure 28 located in the second region B. The capacitor structure 27 extends along the Y-axis direction, and the bit line structure 28 extends along the Z-axis direction.

In some embodiments, continuing to refer to FIG. 4B and FIG. 4C, the active structure further includes an active pillar. The active pillar and the channel structure 18 are arranged along the second direction in sequence. The active pillar includes a first sub-pillar 251 and a second sub-pillar 252. The capacitor structure 27 is formed on an end surface of the first sub-pillar 251, and the bit line structure 28 is formed on an end surface of the second sub-pillar 252.

In some embodiments, continuing to refer to FIG. 4A to FIG. 4C, there is a first isolation groove 12 between the first sub-pillar 251 and the second sub-pillar 252 of the same active pillar, and there is a second isolation groove 13 between adjacent active pillars along the first direction. The dimension L2 of the second isolation groove 13 along the second direction is greater than the dimension L1 of the first isolation groove 12 along the second direction.

In the embodiments of the disclosure, the first isolation groove 12 may be L-shaped or rectangular.

In the embodiments of the disclosure, referring to FIG. 4A, the semiconductor structure further includes: a source S and a drain D.

In some embodiments, continuing to refer to FIG. 4B and FIG. 4C, the capacitor structure 27 is located on the first sub-pillar 251. The bit line structure 28 is located on the second sub-pillar 252. The capacitor structure 27 includes a first electrode layer 271, a dielectric layer 272, and a second electrode layer 273.

The semiconductor structure provided by the embodiments of the disclosure is similar to that formed by the method for forming the semiconductor structure provided by the abovementioned embodiments. The technical features not disclosed in detail in the embodiments of semiconductor structure in the disclosure can refer to the above mentioned embodiments of the related method for understanding, and will not be elaborated herein.

According to the semiconductor structure provided by the embodiments of the disclosure, the word line trench is formed by using a self-aligned process, and the horizontal word line structure is directly formed by filling a word line material, which can realize the control to the length and the width of the gate, so that the complexity of a manufacturing process of the horizontal word line structure is reduced, thereby reducing the manufacturing cost of the semiconductor structure.

FIG. 5A to FIG. 5F schematically illustrate plane structures of the semiconductor structure provided by the embodiments of the disclosure. As shown in FIG. 5A to FIG. 5F, the semiconductor structure 100 includes gate structures 30, bit line structures 28, and capacitor structures 27 that are arranged in arrays along the X-axis direction and the Z-axis direction. Both the bit line structure 28 and the capacitor structure 27 are connected with one gate structure 30.

In the embodiments of the disclosure, a gate structure 30 and a capacitor structure 27 constitute a storage unit. Adjacent storage units along the X-axis direction have the same layout (as shown in FIG. 5A to FIG. 5E), or the adjacent storage units along the X-axis direction are axisymmetric (as shown in FIG. 5F).

In some embodiments, continuing to refer to FIG. 5A to FIG. 5F, the semiconductor structure 100 further includes a word line structure 22 extending along the X-axis direction. Each layer of the word line structure 22 is connected with a plurality of corresponding gate structures 30 arranged along the X-axis direction.

In the embodiments of the disclosure, continuing to refer to FIG. 5A to FIG. 5F, the semiconductor structure 100 further includes a source S, a drain D, a first contact structure 311 connected with the drain D, and a second contact structure 312 connected with the source S.

Figure 5A:
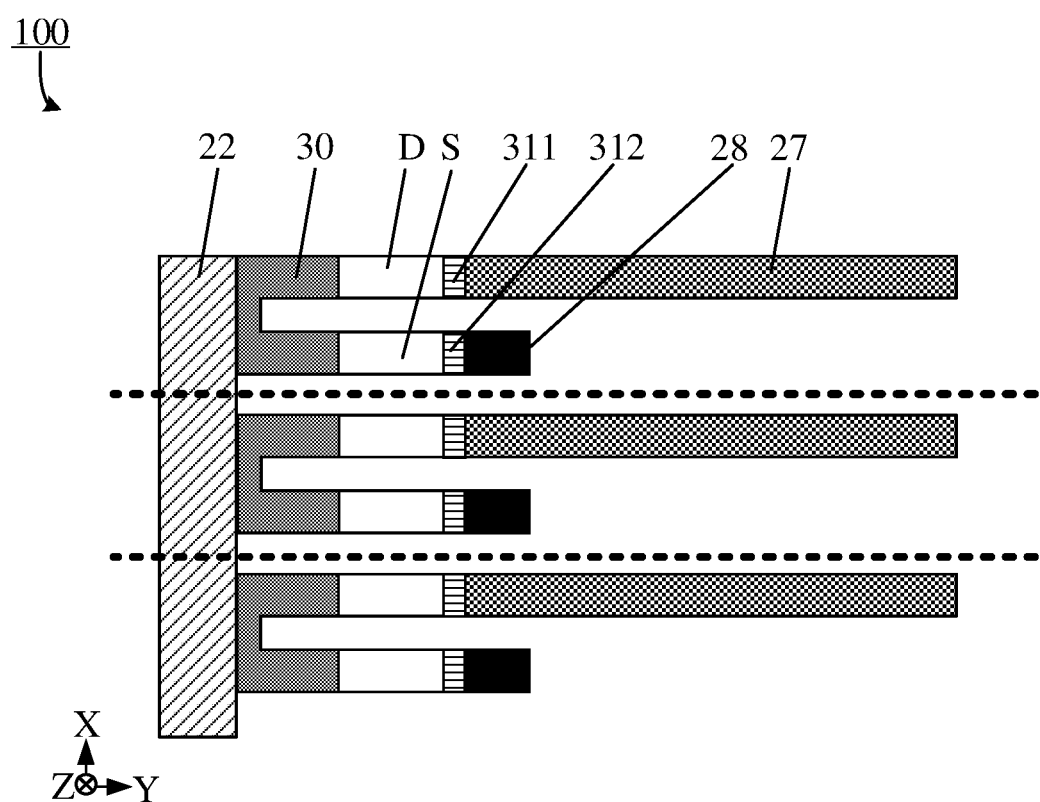
FIG. 5A to FIG. 5F schematically illustrate plane structures of the semiconductor structure provided by the embodiments of the disclosure.
Figure 5B:
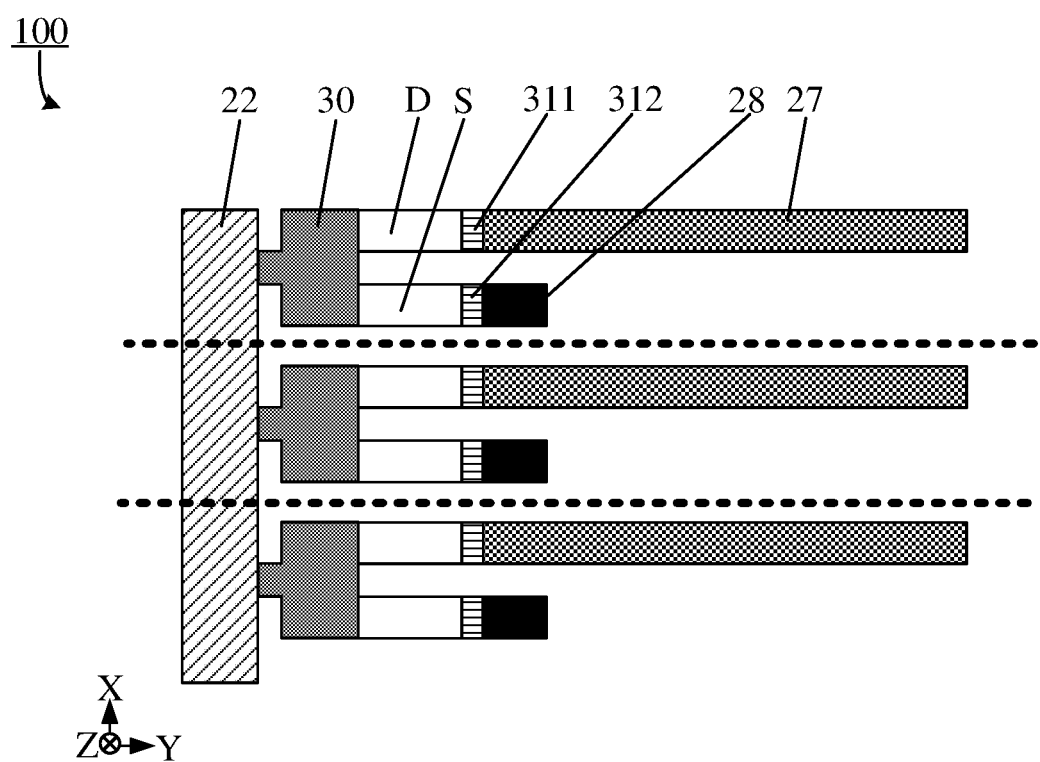
Figure 5C:
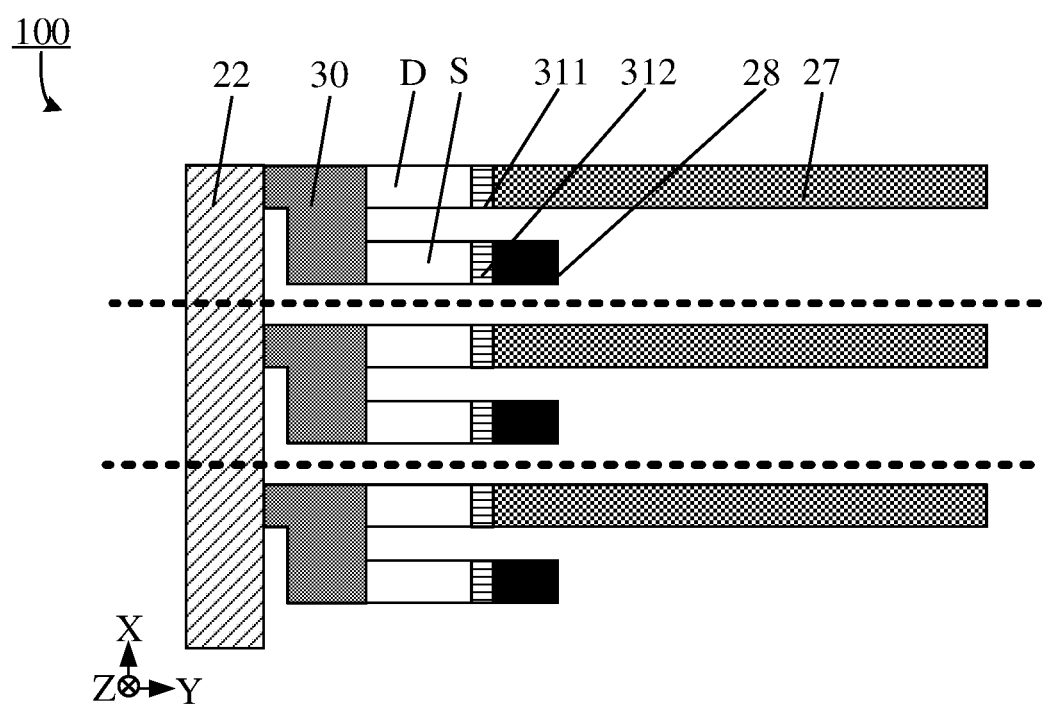
Figure 5D:
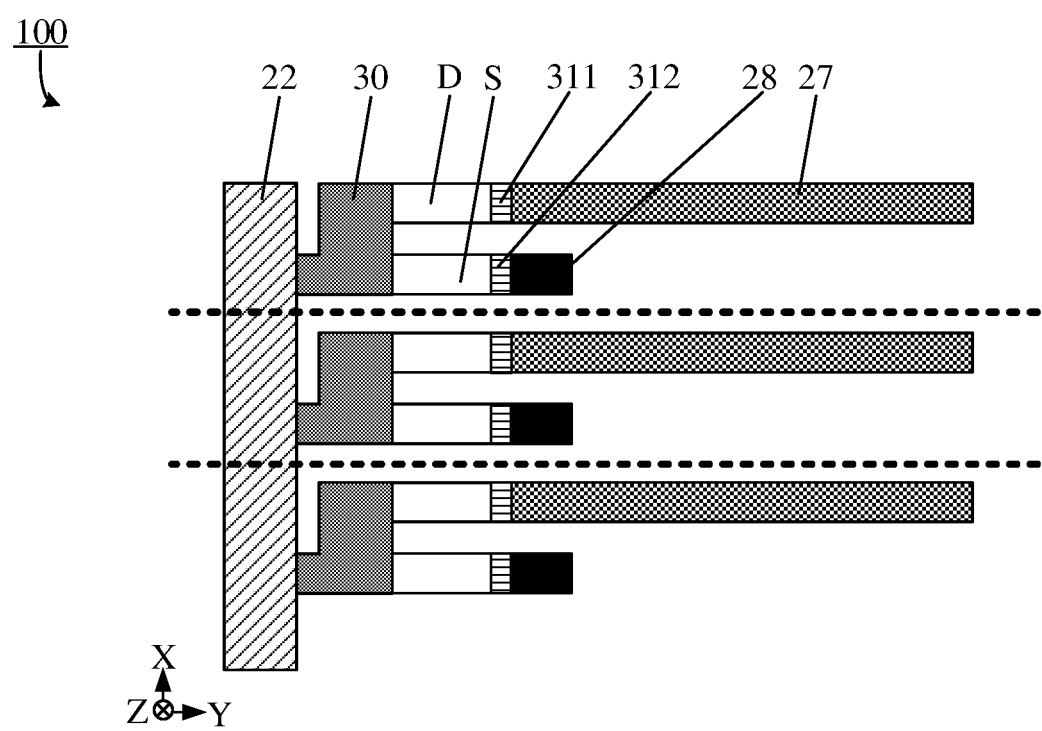
Figure 5E:
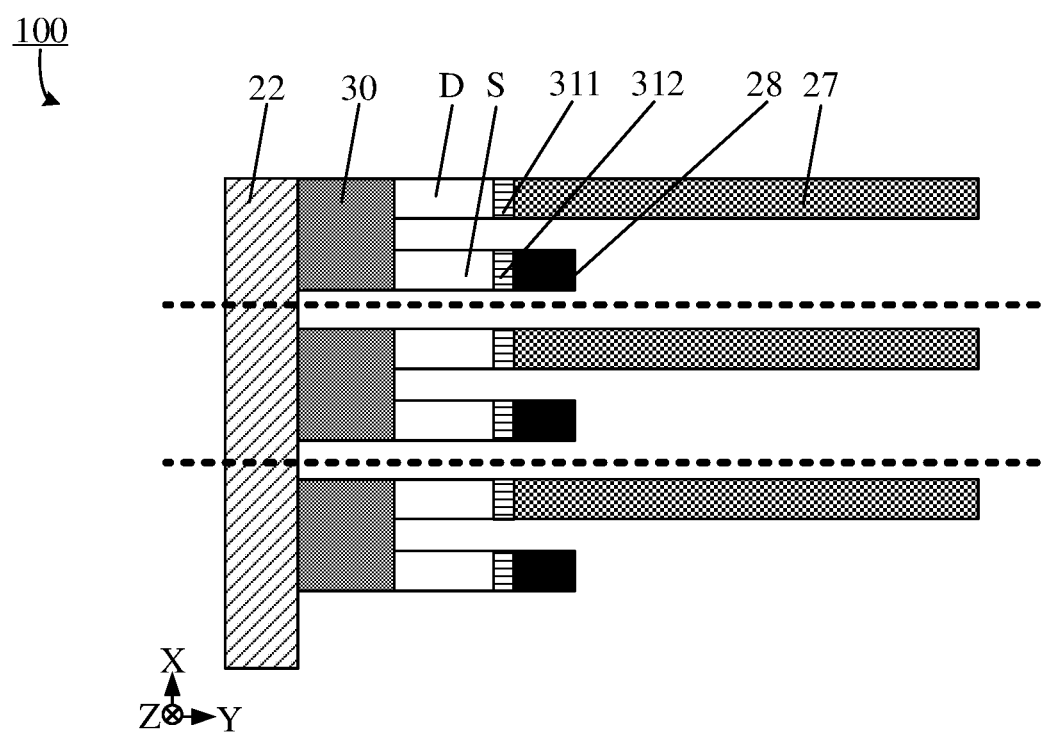
Figure 5F:
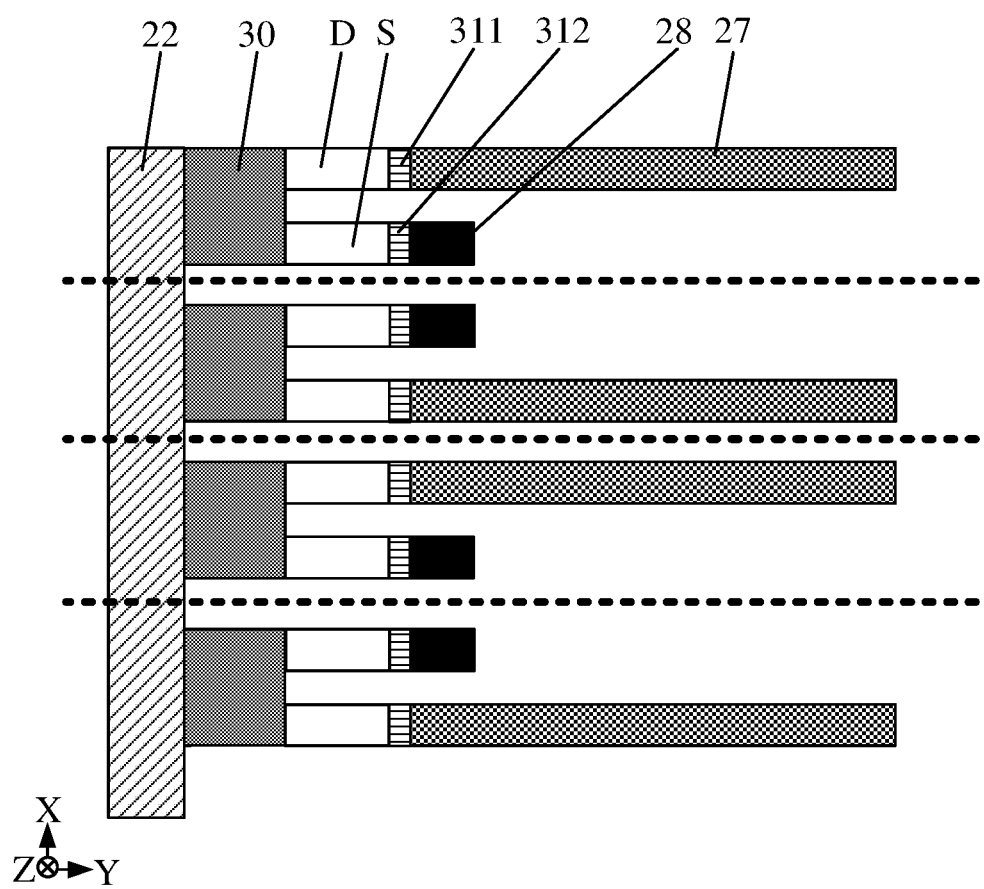

In the embodiments of the disclosure, the gate structure 30 may be U-shaped (as shown in FIG. 5A), rectangular (as shown in FIG. 5E and FIG. 5F), convex (as shown in FIG. 5B), or L-shaped (as shown in FIG. 5C and FIG. 5D).

The embodiments of the disclosure further provide a transistor structure. The transistor structure includes a source, a drain, and a gate structure that surrounds a channel structure.

The gate structure may be a five-sided Gate-All-Around structure. The projection of the gate structure on the surface of the semiconductor substrate (or in the third direction) may be rectangular, convex, or U-shaped, or may also be L-shaped. The drain is connected with the capacitor structure through the first contact structure, and the source is connected with the bit line structure through the second contact structure.

The transistor structure provided by the embodiments of the disclosure is similar to that of the semiconductor structure in the abovementioned embodiments. The technical features not disclosed in detail in the embodiments of the disclosure will be understood with reference to the abovementioned embodiments, which will not be elaborated herein.

In the embodiments of the disclosure, the shape of the gate structure may be flexibly controlled as needed, so that miniaturization may be realized by effectively using the space in the semiconductor structure.

Figure 6A:
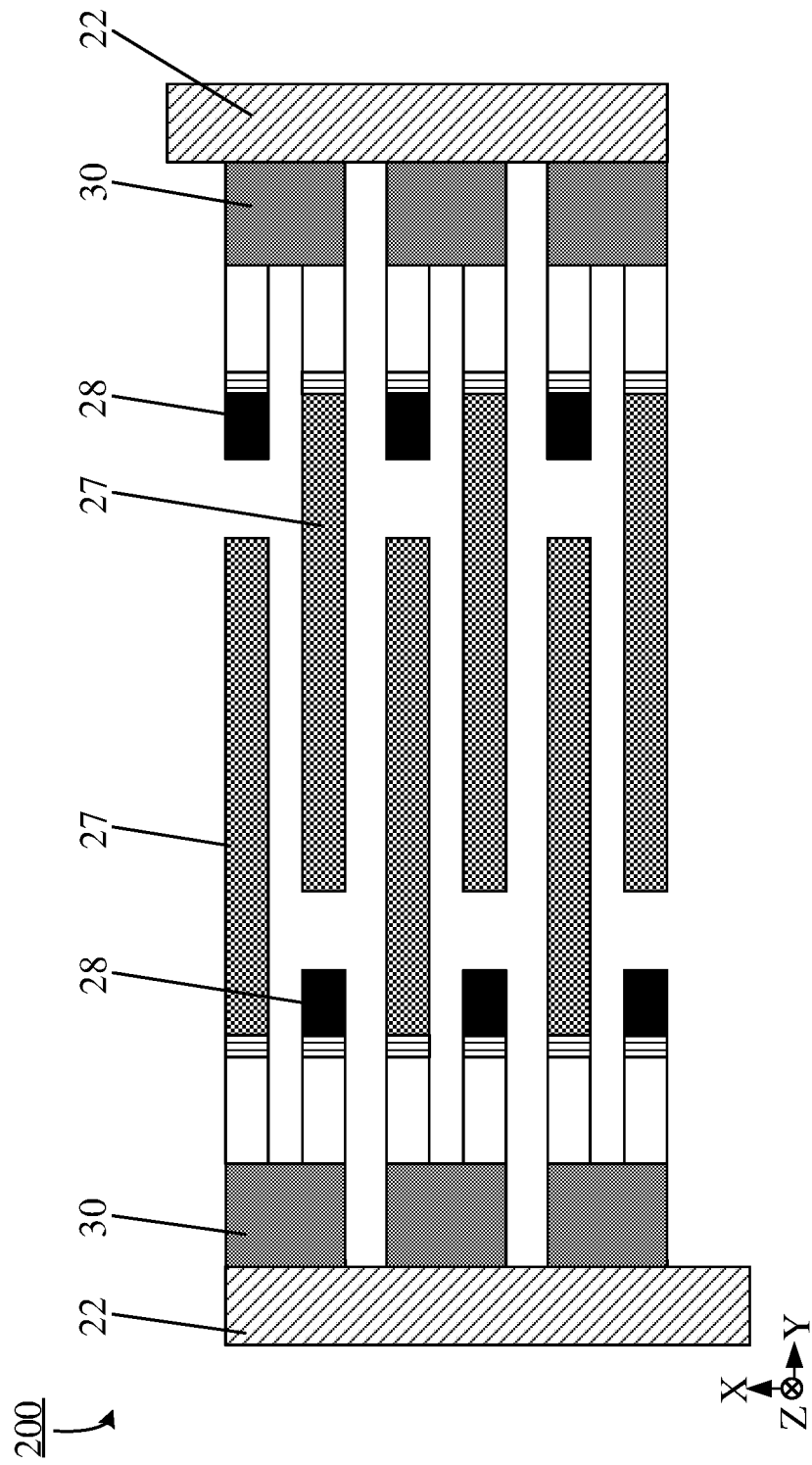
FIG. 6A and FIG. 6B illustrate plane layouts of a layout structure provided by the embodiments of the disclosure.
Figure 6B:
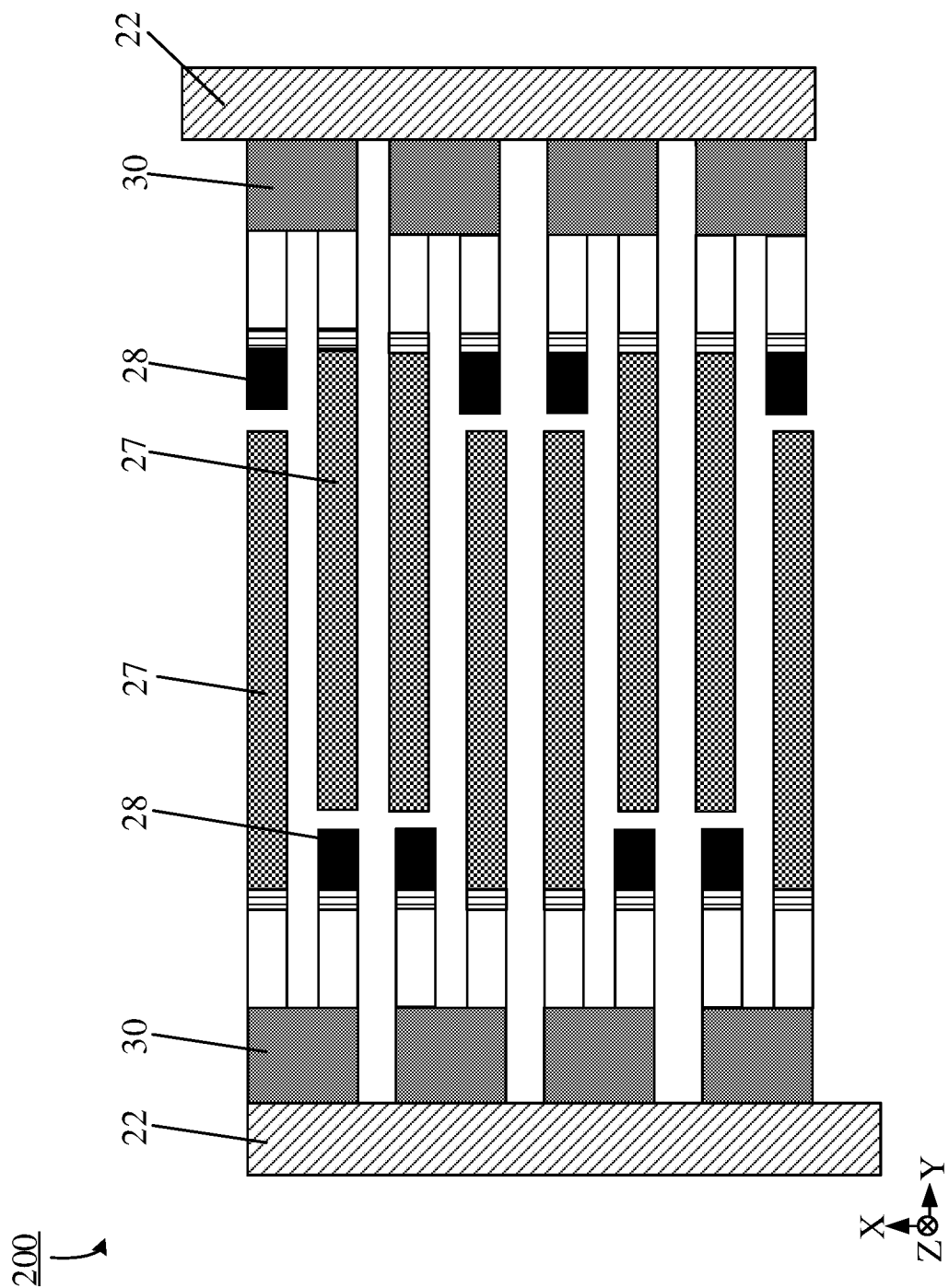

In addition, the embodiments of the disclosure further provide a layout structure. FIG. 6A and FIG. 6B show plane layouts of a layout structure provided by the embodiments of the disclosure. The layout structure 200 includes: the abovementioned semiconductor structures 100 arranged at intervals along the Y-axis direction.

As shown in FIG. 6A and FIG. 6B, the semiconductor structure 100 includes storage units arranged in an array along the X-axis direction and the Y-axis direction. The storage unit includes a gate structure 30 and a capacitor structure 27. Two adjacent storage units in the Y-axis direction are centrosymmetric, and the projection areas, in the X-axis direction, of the capacitor structures 27 of the two adjacent storage units in the Y-axis direction are at least partially overlapped.

In some embodiments, continuing to refer to FIG. 6A and FIG. 6B, the semiconductor structure 100 further includes a bit line structure 28 and a word line structure 22.

In some embodiments, continuing to refer to FIG. 6A, two adjacent storage units in the X-axis direction have the same layout.

In some embodiments, continuing to refer to FIG. 6B, two adjacent storage units in the X-axis direction are axisymmetric.

The layout structure provided by the embodiments of the disclosure can effectively use the space in the semiconductor structure, thereby realizing the miniaturization of the semiconductor structure.

In several embodiments provided by the disclosure, it is to be understood that the disclosed device and method may be implemented in non-targeted ways. The device embodiments described above are only schematic. For example, the division of the units is only logical function division. In actual implementation, there may be other division modes, for example, a plurality of units or components may be combined, or may be integrated into another system, or some features may be ignored or not implemented.

The characteristics disclosed in several method or device embodiments provided in the disclosure may be flexibly combined without conflict to obtain new method embodiments or device embodiments.

The abovementioned descriptions are only some implementation modes of the disclosure, but the scope of protection of the disclosure is not limited thereto. Any variation or replacement readily figured out by a person skilled in the art within the technical scope disclosed in the disclosure shall fall within the scope of the protection of the disclosure. Therefore, the scope of the protection of the disclosure shall be subject to the scope of protection of the claims.

INDUSTRIAL APPLICABILITY

The method for forming the semiconductor structure provided by the embodiments of the disclosure can realize the control to the length and the width of the gate. The formed word line structure is horizontal, and the horizontal word bit structure may be directly formed by filling, which reduces the complexity of the manufacturing process of the horizontal word line structure, thereby reducing the manufacturing cost of the semiconductor structure.

The invention claimed is:

1. A method for forming a semiconductor structure, comprising:
providing a semiconductor substrate, wherein the semiconductor substrate comprises a first region and a second region arranged in sequence along a second direction without overlapping, the second region comprises active structures arranged in an array along a first direction and a third direction, each of the active structures at least comprises a channel structure; the first direction, the second direction, and the third direction are perpendicular to each other, and the first direction and the second direction are parallel to a surface of the semiconductor substrate;

forming a gate structure on a surface of the channel structure; and forming a word line structure extending along the first direction in the first region, wherein the word line structure is connected with the gate structure located on a same layer.

2. The method of claim 1, wherein a projection of the channel structure on the surface of the semiconductor substrate is U-shaped or rectangular.

3. The method of claim 2, wherein each of the active structures further comprises an active pillar; the active pillar and the channel structure are arranged in sequence along the second direction; the channel structure is connected with the active pillar; the method further comprises:

forming a capacitor structure and a bit line structure on an end face of the active pillar, wherein the capacitor structure extends along the second direction, and the bit line structure extends along the third direction.

4. The method of claim 3, wherein the channel structure is formed by:

forming a stacked structure on the surface of the semiconductor substrate, wherein the stacked structure comprises first semiconductor layers and second semiconductor layers stacked alternately along the third direction;

etching the stacked structure and part of the semiconductor substrate to form first isolation grooves, second isolation grooves and a etched trench, wherein the first isolation grooves and the second isolation grooves are located in the second region, extend along the second direction, and are arranged alternately at intervals, the etched trench is located in the first region and extends along the first direction, wherein a dimension of the first isolation grooves along the second direction is smaller than a dimension of the second isolation groove along the second direction, and the second isolation grooves are communicated with the etched trench; and processing the stacked structure remaining in the second region to form the channel structure.

5. The method of claim 4, wherein the stacked structure remaining in the second region comprises a first part located on both sides of each of the first isolation grooves along the first direction, and a second part connected with the first part along the second direction; the processing the stacked structure remaining in the second region to form the channel structure comprises:

forming first isolation layers in the first isolation grooves, the second isolation grooves, and the etched trench, wherein a surface of each of the first isolation layers is flush with a surface of the stacked structure;

forming a first mask layer with a preset pattern on the surface of the stacked structure and the surface of each of the first isolation layers, wherein the preset pattern exposes part of the first isolation layers located in the etched trench and part of the stacked structure in the second part, and the first mask layer is flush with both sides of each of the first isolation grooves along the second direction; and removing the exposed part of the first isolation grooves and the first semiconductor layer in the exposed part of the second part by the first mask layer to form a gate trench, wherein the second semiconductor layer remaining in the exposed part of the second part constitutes the channel structure.

6. The method of claim 5, wherein the word line structure and the gate structure are formed by:

forming a gate dielectric layer and a gate conductive layer covering the channel structure on an inner wall of the gate trench in sequence, so as to form an initial gate structure;

forming a second isolation layer in the gate trench having the gate dielectric layer and the gate conductive layer, wherein a surface of the second isolation layer is flush with the surface of the stacked structure;

removing the first isolation layer remaining in the etched trench and the gate dielectric layer and the gate conductive layer located on a side wall of the second isolation layer in the gate trench, so as to expose part of the etched trench;

forming a third isolation layer at the exposed part of the etched trench;

processing the stacked structure in the first region, as well as the second isolation layer and the third isolation layer in the etched trench to form the word line structure; and processing the initial gate structure to form the gate structure.

7. The method of claim 6, wherein the processing the stacked structure in the first region, as well as the second isolation layer and the third isolation layer in the etched trench to form the word line structure comprises:

removing the second semiconductor layer in the first region, as well as the third isolation layer and the second isolation layer located in a projection area of the second semiconductor layer along the second direction, so as to form a word line trench; and filling the word line trench with a word line metal material, to form the word line structure.

8. The method of claim 7, after forming the word line structure, further comprising:

removing the first semiconductor layer in the first region to form a third isolation groove; and forming a fourth isolation layer in the third isolation groove.

9. The method of claim 6, wherein the processing the initial gate structure to form the gate structure comprises:

forming a second mask layer with a zigzag pattern on a surface of the word line structure and a surface of the initial gate structure, wherein the zigzag pattern comprises convex patterns and concave patterns alternately arranged in sequence along the first direction, and the concave patterns expose part of the initial gate structure; and removing the exposed part of the initial gate structure by the second mask layer to form the gate structure and a first space.

10. The method of claim 9, further comprising:
forming the active pillar while forming the gate structure.

11. The method of claim 10, wherein the active pillar is formed by:

removing the second semiconductor layer in the first part and the first isolation layer located in the first part to form a second space, as well as first sub-pillars and second sub-pillars alternately arranged at intervals along the first direction, wherein the first sub-pillar and the second sub-pillar constitute the active pillar, and the second space comprises the first space.

12. The method of claim 11, further comprising:
forming a fifth isolation layer in the second space.

13. The method of claim 11, wherein the forming the capacitor structure and the bit line structure on the surface of the active pillar comprises:
- forming the capacitor structure on an end face, away from the word line structure, of the first sub-pillar; and
- forming the bit line structure on an end face, away from the word line structure, of the second sub-pillar.

14. A semiconductor structure, at least comprising:
- a semiconductor substrate comprising a first region and a second region arranged in sequence along a second direction without overlapping;
- active structures located on the second region, arranged in an array along a first direction and a third direction, each of the active structures at least comprising a channel structure, wherein the first direction, the second direction, and the third direction are perpendicular to each other, and the first direction and the second direction are parallel to a surface of the semiconductor substrate;
- a word line structure located in the first region and extending along the first direction; and
- a gate structure located on a surface of the channel structure, wherein the word line structure is connected with the gate structure located on a same layer.

15. The semiconductor structure of claim 14, wherein a projection of the channel structure on the surface of the semiconductor substrate is U-shaped, rectangular, L-shaped, or convex.

16. The semiconductor structure of claim 15, wherein the gate structure covers a first surface and a second surface of the channel structure along the third direction, a third surface and a fourth surface of the channel structure along the first direction, and a fifth surface of the channel structure along the second direction; the word line structure is connected with the gate structure located on the fifth surface; and
the gate structure comprises a gate dielectric layer and a gate conductive layer that are stacked.

17. The semiconductor structure of claim 14, wherein the semiconductor structure further comprises a capacitor structure and a bit line structure located in the second region, and wherein the capacitor structure extends along the second direction, and the bit line structure extends along the third direction.

18. The semiconductor structure of claim 17, wherein each of the active structures further comprises an active pillar; the active pillar and the channel structure are arranged in sequence along the second direction; the active pillar comprises a first sub-pillar and a second sub-pillar; the capacitor structure is formed on an end face of the first sub-pillar, and the bit line structure is formed on an end face of the second sub-pillar;
- optionally, there is a first isolation groove between the first sub-pillar and the second sub-pillar of one active pillar, and there is a second isolation groove between adjacent active pillars along the first direction, wherein a dimension of the second isolation groove along the second direction is greater than a dimension of the first isolation groove along the second direction.

19. A layout structure, comprising the semiconductor structures of claim 14 arranged at intervals along the second direction, wherein
- each of the semiconductor structure comprises storage units arranged in an array along the first direction and the third direction; each of the storage units comprises a gate structure and a capacitor structure,
- wherein two adjacent storage units along the second direction are centrosymmetric, and projection areas of capacitor structures of the two adjacent storage units in the second direction are at least partially overlapped in the first direction.

20. The layout structure of claim 19, wherein at least one of:
- a projection of the gate structure in the third direction is U-shaped, rectangular, L-shaped, or convex; or
- two adjacent storage units in the first direction have a same or axisymmetric layout.

* * * * *